(12) United States Patent
Wada et al.

(10) Patent No.: US 7,306,957 B2
(45) Date of Patent: Dec. 11, 2007

(54) FABRICATION METHOD OF SEMICONDUCTOR INTEGRATED CIRCUIT DEVICE

(75) Inventors: Yuji Wada, Tachikawa (JP); Akira Seito, Akishima (JP); Masaaki Namba, Sayama (JP)

(73) Assignee: Renesas Technology Corp., Tokyo (JP)

( * ) Notice: Subject to any disclaimer, the term of this patent is extended or adjusted under 35 U.S.C. 154(b) by 405 days.

(21) Appl. No.: 11/012,225

(22) Filed: Dec. 16, 2004

(65) Prior Publication Data
US 2005/0153465 A1 Jul. 14, 2005

(30) Foreign Application Priority Data
Dec. 22, 2003 (JP) ............... 2003-425616

(51) Int. Cl.
*G01R 31/26* (2006.01)
(52) U.S. Cl. ............... 438/14; 438/15; 438/18; 257/48; 257/E23.179
(58) Field of Classification Search ........... 438/14, 438/15, 18; 257/48, E23.179
See application file for complete search history.

(56) References Cited

U.S. PATENT DOCUMENTS 6,025,222 A * 2/2000 Kimura et al. ............ 438/240
6,774,494 B2 * 8/2004 Arakawa ............... 257/779

FOREIGN PATENT DOCUMENTS

| JP | 03206639 A | * | 9/1991 |
|----|------------|---|--------|
| JP | 05-055328  |   | 3/1993 |
| JP | 06-283657  |   | 10/1994 |
| JP | 08211122 A | * | 8/1996 |
| JP | 2000-040390 |  | 2/2000 |
| JP | 2003-057292 |  | 2/2003 |
| JP | 2005140572 A | * | 6/2005 |

OTHER PUBLICATIONS

Fujitsu, Technical Analysis. "Rapidly Advancing System-in-package Fabrication Technology", vol. 20, No. 3, 2002, pp. 3-11.*

* cited by examiner

*Primary Examiner*—Michael Lebentritt
*Assistant Examiner*—Abdulfattah Mustapha
(74) *Attorney, Agent, or Firm*—Antonelli, Terry, Stout & Kraus, LLP.

(57) ABSTRACT

A memory test is carried out on semiconductor integrated circuit devices including a semiconductor memory at low cost with efficiency. In a test burn-in system, twenty-four test boards are processed in sequence with time differences, and the test boards are circulated one by one. In this case, the memory test is conducted with the sequence of single board processing: the test is started with a test board in which semiconductor integrated circuit devices have been embedded, and semiconductor integrated circuit devices are discharged, beginning with a test board that has undergone the test.

9 Claims, 22 Drawing Sheets

FIG. 9

OVERVIEW OF SPECIFICATIONS

| | |
|---|---|
| TEMPERATURE SETTING | TEMPERATURE SHALL BE SETTABLE BETWEEN 55 AND 130°C INCLUSIVE. |
| TEMPERATURE ACCURACY | ±3.0°C (55 TO 90°C), ±5°C (90 TO 130°C) |
| INCREMENTS OF TEMPERATURE | 1°C OR LESS |
| NUMBER OF CATEGORIES | 3 CATEGORIES (DEFECTIVE, NON-DEFECTIVE, INITIAL DEFECTIVE) |
| SLOT PITCH | 50 mm |
| BOARD COOLING | FORCED COOLING (ROOM TEMPERATURE) BY FAN SHALL BE TAKEN INTO ACCOUNT. |
| THERMOSTATIC BATH | TO BE CAPABLE OF DEALING WITH CONVENTIONAL TEST BOARDS. |
| MINIMUM TEST TIME | 15 MINUTES OR LESS |
| UNTESTED ARTICLES | TO BE SUPPLIED IN TRAY. |
| BOARD ID RECOGNITION | BARCODE (BOARD TO BE MANAGED BY HANDLER. HANDLER SHALL BE PROVIDED WITH FUNCTIONS FOR THIS PURPOSE.) |

FIG. 10

| ITEM | | FUNCTIONS |
|---|---|---|
| FUNCTIONS OF CPU MODULE | SIGNAL FOR TEST BOARD | · CONTROL FPGA AND GENERATE SIGNAL TO TEST BOARD.<br>· LATCH I/O SIGNAL OF TEST BOARD BY FPGA COMPARATOR, AND MAKE PASS/FAIL DECISION. |
| | POWER SUPPLY FOR TEST BOARD | · SET VOLTAGE OF VARIABLE POWER SUPPLY.<br>· MONITOR VOLTAGE OF VARIABLE POWER SUPPLY.<br>· MONITOR CURRENT OF VARIABLE POWER SUPPLY ← DELETE.<br>· GIVE ALARM IF OVERCURRENT IS DETECTED IN VARIABLE POWER SUPPLY. |
| | INPUT/OUTPUT | · CONTROL Ethernet COMMUNICATION WITH CONTROL TERMINAL.<br>· CONTROL CF CARD READ/WRITE. |
| | OTHERS | · CONFIGURE FPGA. (USUALLY, CONFIGURATION ROM IS USED.) |
| | METHOD FOR PROGRAM LOAD | · LOAD PROGRAM FROM CONTROL TERMINAL INTO MEMORY THROUGH LAN, AND EXECUTE IT.<br>· READ PROGRAM FROM CF CARD, AND EXECUTE IT. |
| | OUTPUT OF TEST RESULT | · OUTPUT TEST RESULT TO HOST PC THROUGH LAN.<br>· OUTPUT RESULT FILE TO CF CARD. |
| FUNCTIONS OF CONTROL TERMINAL (DOS/V PC) | CREATION OF PROGRAM | · CREATE PROGRAM FOR INDIVIDUAL CPU IN C LANGUAGE BY CROSS COMPILER ON CONTROL TERMINAL. |
| | COMMUNICATION | · DOWNLOAD PROGRAM TO CPU MODULE (LAN i/f).<br>· DOWNLOAD ROM DATA TO CPU MODULE (LAN i/f).<br>· PERFORM TEST START PROCESSING FOR CPU MODULE.<br>· PROCESS TEST RESULT FROM CPU MODULE.<br>· CARRY OUT TEST START/TEST END COMMUNICATION WITH HANDLER.<br>· CONTROL FPGA THROUGH CPU MODULE, AND MANUALLY GENERATE SIGNAL TO TEST BOARD. |
| | OUTPUT OF TEST RESULT | · INDICATE RESULT ON DISPLAY.<br>· OUTPUT TEST RESULT LOG TO FILE.<br>· OUTPUT TEST END AND RANK DATA TO HANDLER. |
| | OTHERS | · RESET CPU MODULE. |

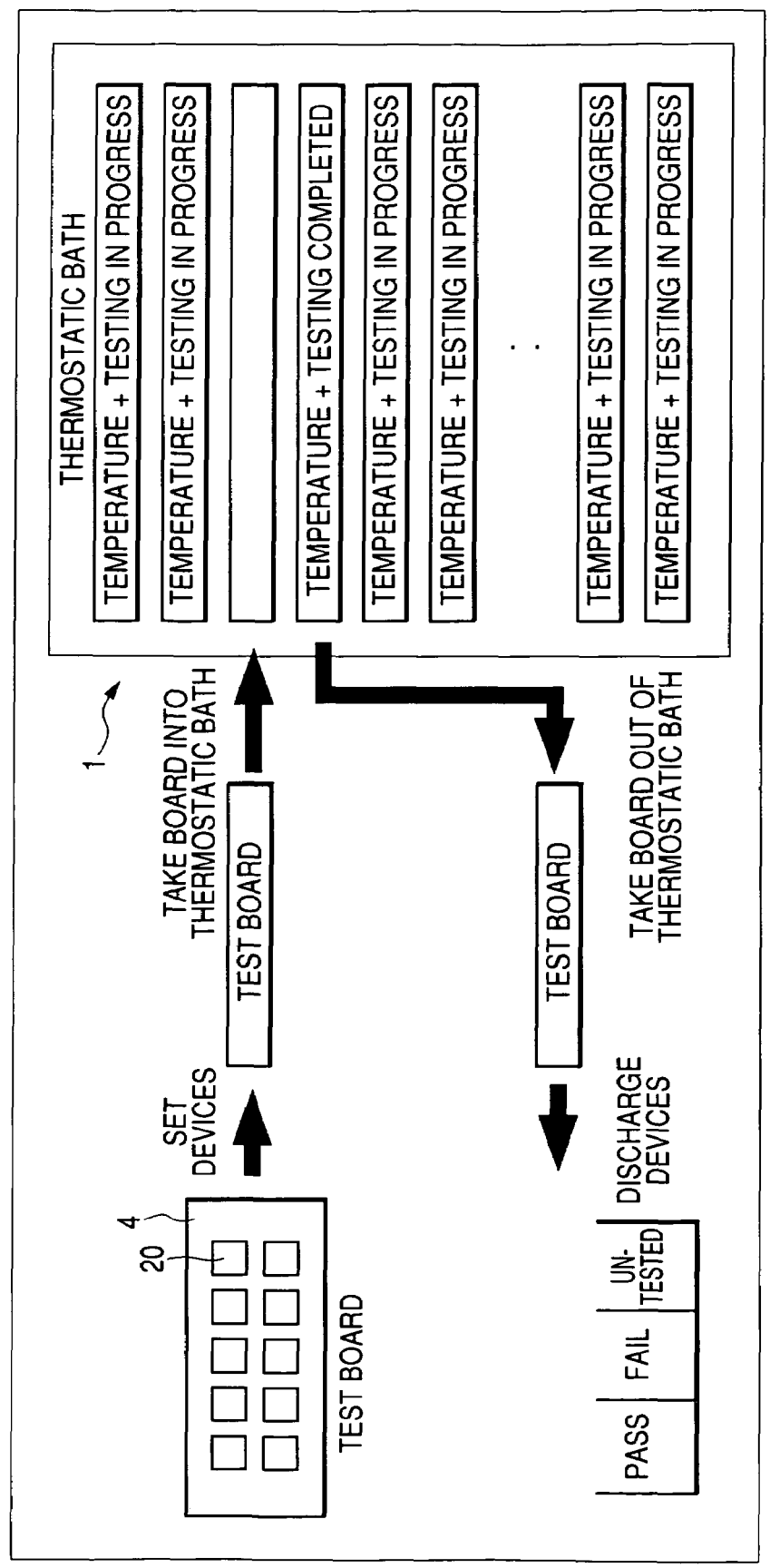

US 7,306,957 B2

FABRICATION METHOD OF SEMICONDUCTOR INTEGRATED CIRCUIT DEVICE

CROSS-REFERENCE TO RELATED APPLICATION

The present application claims priority from Japanese patent application No. 2003-425616, filed on Dec. 19, 2003, the content of which is hereby incorporated by reference into this application.

BACKGROUND OF THE INVENTION

The present invention relates to a method fabrication of semiconductor integrated circuit devices, and, more particularly, to a technique that is effective when applied to the testing of semiconductor integrated circuit devices, including semiconductor memories.

Various techniques have been proposed with respect to test burn-in systems which evaluate and determine the acceptability of semiconductor integrated circuit devices that constitute devices to be tested in burn-in. An example of such proposals is Japanese Unexamined Patent Publication No. Hei 06(1994)-283657 (Patent Document 1). As described in Patent Document 1, test burn-in systems are based on batch processing.

There are various test techniques for test burn-in systems. Examples include: Japanese Unexamined Patent Publication No. 2003-57292 (Patent Document 2), Japanese Unexamined Patent Publication No. 2000-40390 (Patent Document 3), and Japanese Unexamined Patent Publication No. Hei 05(1993)-55328 (Patent Document 4). Patent Document 2 discloses a technique wherein burn-in boards are divided into test groups and signals are supplied on a test group-by-test group basis in burn-in. Patent Document 3 discloses a technique wherein semiconductor integrated circuit devices are divided into a plurality of groups and semiconductor integrated circuit devices are subjected to pass/fail tests on a group-by-group basis. Patent Document 4 discloses a technique wherein, with voltage continuously applied, semiconductor integrated circuit devices are transported in a thermostatic bath and each semiconductor integrated circuit device is subjected to electrical tests at a test station.

[Patent Document 1] Japanese Unexamined Patent Publication No. Hei 06(1994)-283657
[Patent Document 2] Japanese Unexamined Patent Publication No. 2003-57292
[Patent Document 3] Japanese Unexamined Patent Publication No. 2000-40390
[Patent Document 4] Japanese Unexamined Patent Publication No. Hei 05(1993)-55328

SUMMARY OF THE INVENTION

Semiconductor integrated circuit devices that are tested using test burn-in systems include a SiP (System in Package). This type of semiconductor integrated circuit device is a product obtained by stacking a plurality of semiconductor chips of logics, such as microcomputers, and semiconductor memories, and encapsulating them in a package.

The SiP is expected to significantly grow in demand in the future. To enhance the manufacturing efficiency, consideration has been given to shortening the time required for testing the semiconductor memory portion. The result of such consideration indicates that omission of burn-in and a shortening of the memory test time can be expected.

As a result, the test time has been significantly shortened. However, there still remains a problem even though the test time can be shortened. In batch processing, the throughput can be hardly enhanced because of the influence of the time required for attaching and detaching semiconductor integrated circuit devices and the setup.

By preparing a large number of test boards for testing semiconductor integrated circuit devices, the influence of the time required for attaching and detaching semiconductor integrated circuit devices and the setup can be reduced. However, a problem is left unsolved. The test boards are densely mounted with sockets into which semiconductor integrated circuit devices are inserted and peripheral circuits, including FPGAs (Field Programmable Gate Arrays), SRAMs (Static Random Access Memories), buffers, and the like. Preparing a large number of test boards can extraordinarily increase the test cost.

One of the possible methods for carrying out memory tests on SiPs, other than batch methods, is a method in which common memory testers and handlers are employed. This method is based on the assumption that the test time is no more than several minutes, and the number of pieces simultaneously measurable is 256 pieces or so at the maximum. This can degrade the efficiency.

An object of the present invention is to shorten the time required for testing semiconductor integrated circuit devices.

Another object of the present invention is to significantly reduce the cost of testing semiconductor integrated circuit devices.

A further object of the present invention is to provide a test method which takes only a moderately long time and is suitable for testing semiconductor integrated circuit devices.

A still further object of the present invention is to provide a test technique which makes it possible to carry out memory tests on semiconductor integrated circuit devices, including a semiconductor memory, at low cost with the efficiency.

These and other objects and novel features of the present invention will become apparent from the description provided in the present specification and the accompanying drawings.

The following is a brief description of the gist of representative aspects of the invention laid open in this application.

A method of fabrication of semiconductor integrated circuit devices according to the present invention comprises: a step in which one test board whose testing has been completed is taken out while testing is underway on a plurality of semiconductor integrated circuit devices mounted in a plurality of test boards, placed in a thermostatic bath; a step in which a plurality of semiconductor integrated circuit devices are dislodged from the test board; a step in which a plurality of semiconductor integrated circuit devices to be tested are mounted in the test board with the semiconductor integrated circuit devices dislodged therefrom; and a step in which the test board mounted with the semiconductor integrated circuit devices is placed in the thermostatic bath and the devices are tested.

The following is a brief description of the gist of other representative aspects of the invention laid open in this application.

A method of fabrication of semiconductor integrated circuit devices according to the present invention comprises: a step in which semiconductor integrated circuit devices, comprising SiP products obtained by encapsulating a plurality of semiconductor chips, such as logics and semiconductor memories, in a package, are mounted in a plurality of test boards; and a step in which the test boards are placed in a thermostatic bath and the devices are subjected to a memory test in a lump.

A method of fabrication of semiconductor integrated circuit devices according to the present invention comprises: a step in which one test board whose testing has been completed is taken out while testing is underway on a plurality of semiconductor integrated circuit devices mounted in a plurality of test boards, placed in a thermostatic bath; a step in which a plurality of semiconductor integrated circuit devices are dislodged from the test board; a step in which a plurality of semiconductor integrated circuit devices to be tested are mounted in the test board with the semiconductor integrated circuit devices dislodged therefrom; and a step in which the test board mounted with the semiconductor integrated circuit devices is placed in the thermostatic bath and the devices are tested. In the thermostatic bath, first slots and second slots are different from each other in temperature.

A method of fabrication of semiconductor integrated circuit devices according to the present invention comprises: a step in which one test board whose testing has been completed is taken out by a handler while testing is underway on a plurality of semiconductor integrated circuit devices mounted in a plurality of test boards, placed in a thermostatic bath; a step in which a plurality of semiconductor integrated circuit devices are dislodged from the test board taken out; a step in which the semiconductor integrated circuit devices that have been cooled are sorted and put in by the handler; a step in which a plurality of semiconductor integrated circuit devices to be tested are mounted in the test board with the semiconductor integrated circuit devices dislodged therefrom by the handler; and a step in which the test board mounted with the semiconductor integrated circuit devices is placed in the thermostatic bath by the handler and the devices are tested. In the thermostatic bath, first slots and second slots are different from each other in temperature.

A method of fabrication of semiconductor integrated circuit devices according to the present invention comprises: a step in which one test board whose memory test has been completed is taken out while memory tests are underway on a plurality of semiconductor integrated circuit devices mounted in a plurality of test boards, placed in a thermostatic bath; a step in which a plurality of semiconductor integrated circuit devices are dislodged from the test board; a step in which a plurality of semiconductor integrated circuit devices to be subjected to a memory test are mounted in the test board with the semiconductor integrated circuit devices dislodged therefrom; and a step in which the test board mounted with the semiconductor integrated circuit devices is placed in the thermostatic bath and the devices are subjected to a memory test.

A method of fabrication of semiconductor integrated circuit devices according to the present invention comprises: a step in which two test boards whose testing has been completed are taken out while testing is underway on a plurality of semiconductor integrated circuit devices mounted in a plurality of test boards, placed in a thermostatic bath; a step in which a plurality of semiconductor integrated circuit devices are dislodged from the two test boards; a step in which a plurality of semiconductor integrated circuit devices to be tested are mounted in the two test boards with the semiconductor integrated circuit devices dislodged therefrom; and a step in which the two test boards mounted with the semiconductor integrated circuit devices are placed in the thermostatic bath and the devices are tested.

The following is a brief item-by-item description of the gist of other respective features of the invention laid open in this application:

1. A method of fabrication of semiconductor integrated circuit devices, comprising:
   (a) a step in which one test board whose testing has been completed is taken out while testing is underway on a plurality of semiconductor integrated circuit devices mounted in a plurality of test boards, placed in the containment bath of test equipment;
   (b) a step in which a plurality of semiconductor integrated circuit devices are dislodged from the test board that has been taken out;
   (c) a step in which a plurality of semiconductor integrated circuit devices to be tested are mounted in the test board with the semiconductor integrated circuit devices dislodged therefrom; and
   (d) a step in which the test board mounted with the semiconductor integrated circuit devices is placed in the containment bath, and the test board placed therein is tested.

The following is a brief description of the gist of effects obtained by representative aspects of the invention laid open in this application.

With respect to a plurality of devices on a plurality of boards to be tested, loading to test equipment, the starting and ending of testing, and unloading from test equipment can be carried out on a board-by-board basis. As a result, the test cost can be reduced.

BRIEF DESCRIPTION OF THE DRAWINGS

FIG. 9 is a table showing an outline of the specifications of the test burn-in system in FIG. 1 and the handler in FIG. 2.

FIG. 10 is a table showing n outline of the tester functions of the test burn-in system in FIG. 1.

FIG. 11 is a diagram illustrating an overview of the memory test with the test burn-in system in FIG. 1.

DETAILED DESCRIPTION OF THE PREFERRED EMBODIMENTS

Figure 1:
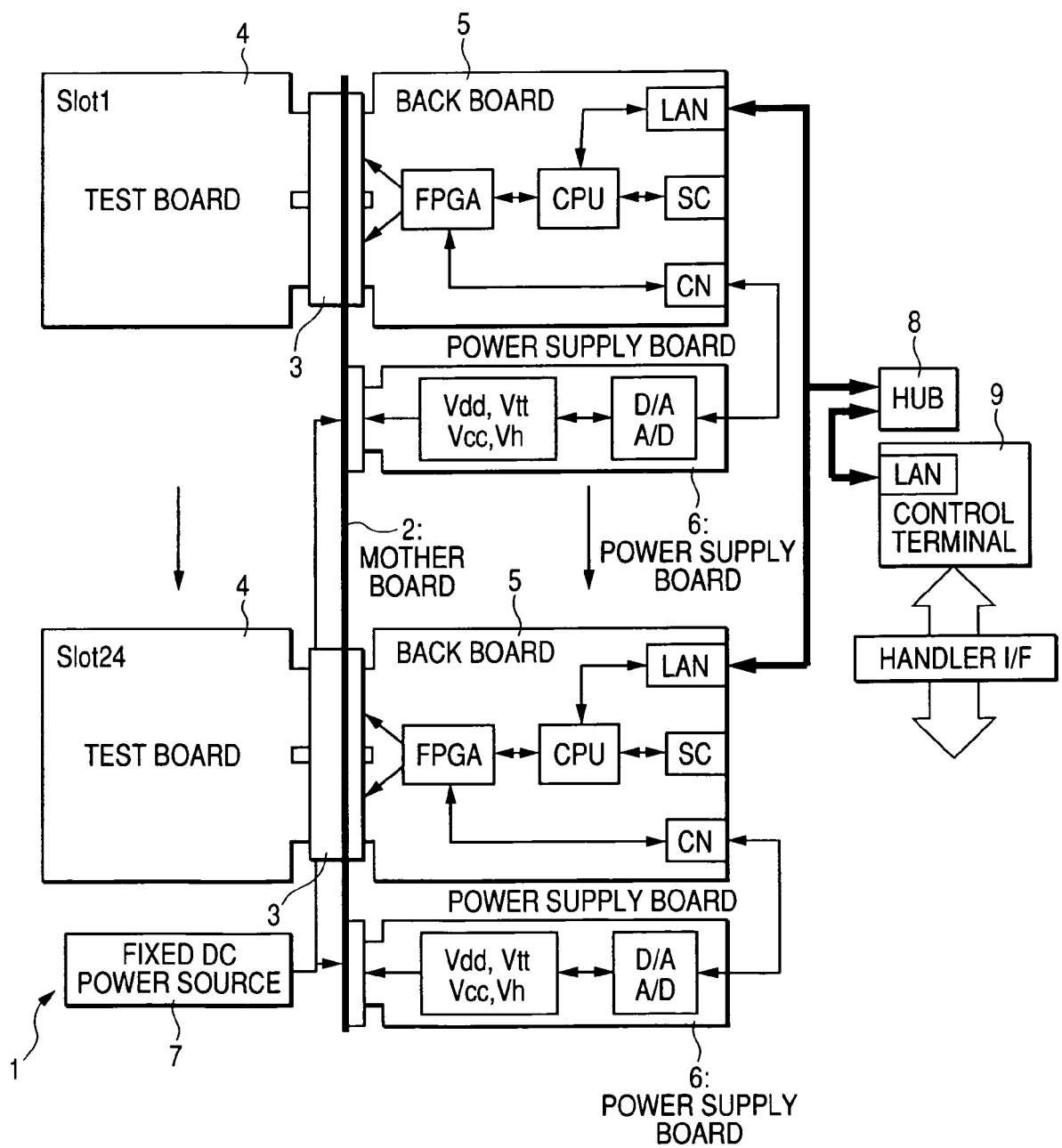
FIG. 1 is a block diagram of a test burn-in system representing an embodiment of the present invention.

Embodiments of the present invention will be described in detail with reference to the drawings. In all of the drawings, the same members will be identified with the same numerals as a rule, and a repetitive description thereof will be omitted.

In the following description of the embodiments, the description of the same or similar elements will not be repeated as a rule unless especially needed.

In the following description of the present invention, the subject matter will be divided into a plurality of sections or embodiments if necessary for the sake of convenience. However, they are not unrelated to each other, but are in such a relation that one represents a modification to, the details of, the supplementary explanation of, or the like of part or all of the other unless otherwise stated.

If reference is made to any number of elements or the like (including a number of pieces, a numeric value, a range, and the like) in the description of the embodiments, the present invention is not to be limited by that value. The number may be greater or less than the value. However, the following cases are excepted: cases where some number is explicitly specified, cases where some number is evidently limited to a specific value in principle, and the like.

In the embodiments described below, the numbers of their components (including constituent steps and the like) are not limited to a specific value. The numbers may be greater or less than the value unless otherwise stated.

Similarly, if reference is made to a shape, positional relationship, or the like of any component or the like in the description of the embodiments, those substantially approximate or analogous to that shape or the like are included. This is the same with the above-mentioned numeric values and ranges.

In this embodiment, which will be described with reference to FIGS. 1 to 22, the test burn-in system (inspection machine, test system) 1 is provided with test functions, to be described later, as well as ordinary burn-in functions. The ordinary burn-in functions include the functions of: placing a plurality of test boards in a test board containment bath; controlling the temperature of the bath to a predetermined value; supplying the individual boards with power and input signals; and outputting the result of pass/fail judgment on the devices to be tested mounted in the boards, based on resultant output signals. The above-mentioned test functions further include the functions of: sequentially and continuously or intermittently carrying out a plurality of tests involving combinations of voltage, signal pattern, and temperature according to programs (the tests may involve only temperature sometimes); and storing the results of the tests in a storage device. For example, the test burn-in system is provided with the following burn-in functions and other functions: the burn-in functions of carrying out screening tests to reject semiconductor devices having an inherent defect or semiconductor integrated circuit devices which can suffer a failure dependent on time and stress due to variation in manufacturing; and the other functions of testing the memory portions of semiconductor integrated circuit devices, determining the acceptability of the semiconductor integrated circuit devices, and sorting them based on the test results.

The tester-handler, which is conceptually similar to the test burn-in system, is capable of carrying out the same tests on single test boards. The present invention is not limited to constitutions using the above-described test burn-in system, and it may be implemented by retrofitting a tester-handler or the like. The primary burn-in function (heating test) is not indispensable.

FIG. 1 is a block diagram illustrating the constitution of the test burn-in system 1. As illustrated in the figure, the test burn-in system 1 is provided with a mother board 2.

This mother board 2 is provided with, for example, about 24 slots 3. Each slot 3 is connected with a test board 4. The test board 4 is mounted with, for example, about 10 semiconductor integrated circuit devices which represent devices to be tested.

The mother board 2 is equipped with about 24 back boards (test control units) 5 and about 24 power supply boards (power supply units) 6 in correspondence with the individual slots 3. The mother board 2 is mounted with a fixed DC power source 7. The power supply boards 6 generate, for example, about three different supply voltages from the power supplied from the fixed DC power source 7. Then, the power supply boards 6 supply these supply voltages to the test boards 4 and the back boards 5.

Figure 2:
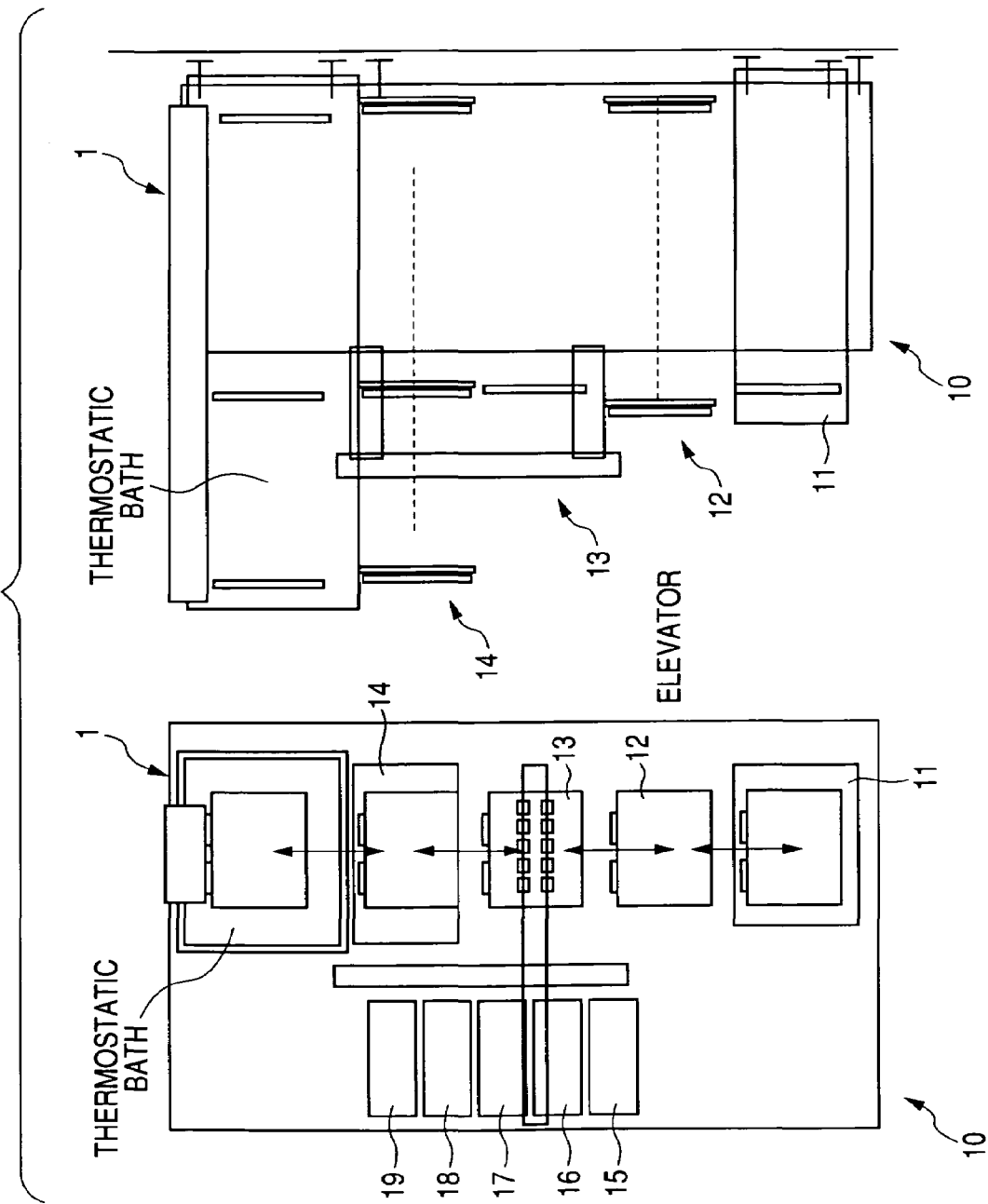
FIG. 2 is a diagram showing front and side views of a handler representing an embodiment of the present invention.

Each back board 5 is connected with a control terminal (test controller) 9 through a hub 8. The control terminal 9 comprises a personal computer, for example, and it is responsible for controlling the tester functions in the BIST (Built-In Self Test) provided in semiconductor integrated circuit devices and the handler (test system) 10 (FIG. 2). The back boards 5 generate test control signals to the test boards 4 and process the test conclusions from the test boards 4 under the control of the control terminal 9.

FIG. 2 is a block diagram providing an overview of the handler 10.

In the plan view on the right of FIG. 2, a board rack 11 is provided at the lower part. An elevator 12 is provided above the board rack 11, and a loader/unloader 13 is provided above the elevator 12. An elevator 14 is provided above the loader/unloader 13, and on the left of the loader/unloader 13, a buffer tray 15, a loader tray 16, a non-defective tray 17, a defective tray 18, and an untested tray 19 are provided from the top down.

The board rack 11 accommodates a plurality of test boards 4 that have not been put to the test. The elevator 12 moves up and down a test board 4 mounted on the board rack 11 to predetermined positions. In addition, when the loader/unloader 13 handles another test board 4, the elevator 12 functions as a buffer for causing a test board 4 to wait until the loader/unloader 13 is emptied. The loader/unloader 13 mounts semiconductor integrated circuit devices to be tested in a test board 4, and dislodges semiconductor integrated circuit devices whose testing has been completed. The elevator 14 moves up and down a test board 4 mounted with semiconductor integrated circuit devices 20 to predetermined positions. In addition, when the slots in the test burn-in system 1 are full, the elevator 14 functions as a buffer for causing a test board 4 to wait until any slot is emptied.

The buffer tray 15 accommodates empty trays. The loader tray 16 accommodates semiconductor integrated circuit devices to be tested. The non-defective tray 17 accommodates semiconductor integrated circuit devices that have been judged as being non-defective after testing. The defective tray 18 accommodates semiconductor integrated circuit devices that have been judged as being defective. The untested tray 19 accommodates untested semiconductor integrated circuit devices. "Untested" is a category under which semiconductor integrated circuit devices 20, that were not subjected to a memory test because of a failure in contact between the semiconductor integrated circuit devices 20 and a socket 4b for measurement (FIG. 6), equipped in the test board are classified. Such semiconductor integrated circuit devices 20 are discharged and are to be reexamined.

Figure 3:
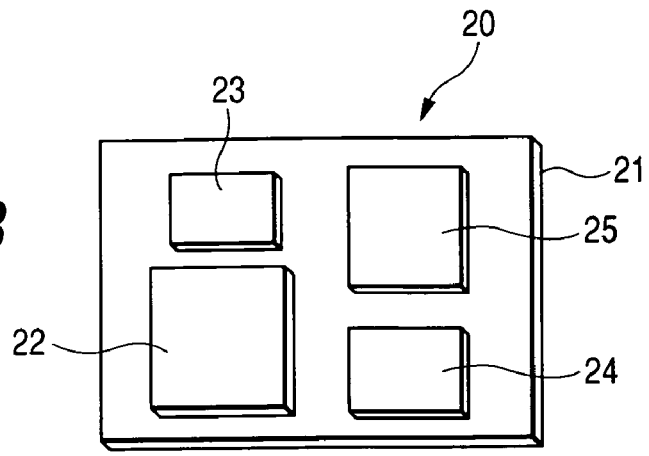
FIG. 3 is a perspective view illustrating an example of a semiconductor integrated circuit device tested with the test burn-in system in FIG. 1.
Figure 4:
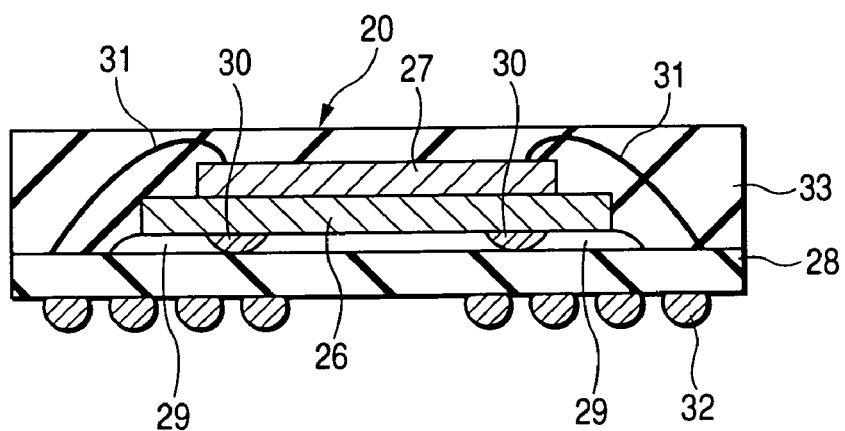
FIG. 4 is a cross-sectional view illustrating another example of a semiconductor integrated circuit device tested with the test burn-in system in FIG. 1.
Figure 5:
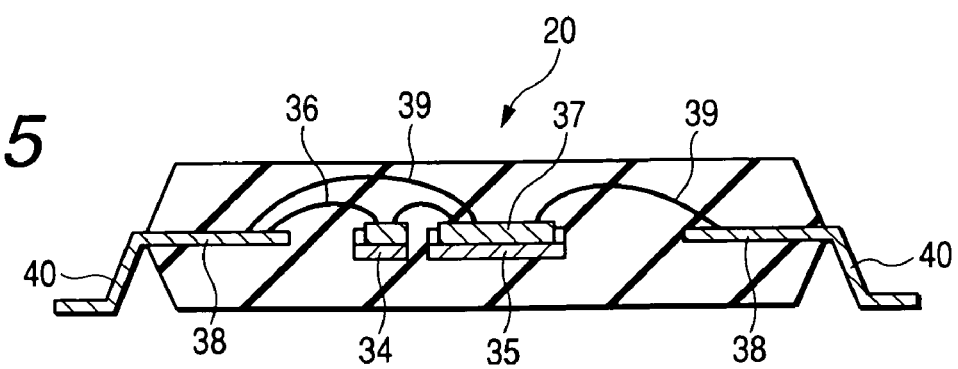
FIG. 5 is a cross-sectional view illustrating an example of a semiconductor integrated circuit device tested with the test burn-in system in FIG. 1.

FIG. 3 is a perspective view illustrating an example of a semiconductor integrated circuit device 20 that is tested with the test burn-in system 1. FIG. 4 and FIG. 5 are cross-sectional views illustrating other examples of semiconductor integrated circuit devices 20 to be tested with the test burn-in system 1.

The semiconductor integrated circuit device 20 illustrated in FIG. 3 comprises a so-called horizontally mounted SiP. The SiP is constituted by mounting semiconductor chips 22 to 25, comprising a microcomputer and a plurality of different types of semiconductor memories, such as a flash memory and a SDRAM (Synchronous Dynamic RAM), on a printed wiring board 21.

On the chip mount face of the printed wiring board 21, electrodes for connection and a wiring pattern are formed. The electrodes for connection and the electrode portions formed on the semiconductor chips 22 to 25 are connected together through bumps or the like.

On the rear face of the printed wiring board 21, bump electrodes and a wiring pattern are formed. The bump electrodes and the electrode portions on the semiconductor chips 22 to 25 are electrically connected together through the wiring pattern and through holes. The bump electrodes are formed in an array with a predetermined pitch, and a solder bump comprising a solder sphere which forms an external connection terminal is formed on each bump electrode.

The semiconductor integrated circuit device 20 in FIG. 4 comprises a stacked SiP wherein two semiconductor chips 26 and 27, comprising a microcomputer and a semiconductor memory, such as a flash memory, are stacked and packaged.

In this case, the semiconductor integrated circuit device 20 in FIG. 4 is constituted of a BGA (Ball Grid Array), which is a type of surface mount CSP. The semiconductor chip 26 is mounted in the center on the chip mount face of the printed wiring board 28.

Electrodes 29 for connection are formed in the center on the chip mount face of the printed wiring board 28, and the electrodes 29 for connection and the electrode portions provided on the rear face of the semiconductor chip 26 are connected together through bumps 30 or the like.

The semiconductor chip 27 is stacked on the semiconductor chip 26, and they are bonded together and fixed through an adhesive, such as insulating resin. On the chip mount face of the printed wiring board 28, bonding electrodes and a wiring pattern are formed in proximity to the peripheral portions on two opposite sides of the semiconductor chip 26. The bonding electrodes provided on the printed wiring board 28 are connected with the electrode portions formed in the peripheral portion of the principal surface of the semiconductor chip 27 through bonding wires 31.

On the rear face of the printed wiring board 28, a plurality of bump electrodes are formed in an array, and a solder bump 32 comprising a solder sphere is formed on each bump electrode.

These semiconductor chips 26 and 27, the areas of the printed wiring board 28 in proximity to the bonding electrodes, and the bonding wires 31 are sealed in sealing resin 33 to form a package.

The semiconductor integrated circuit device 20 in FIG. 5 is of the QFP (Quad Flat Package) type. In this case, two semiconductor chips 36 and 37 comprising, for example, a microcomputer and a flash memory, are mounted on die pads 34 and 35 positioned in the center of the semiconductor integrated circuit device 20.

A plurality of inner leads 38 are positioned in proximity to the four peripheral portions of the semiconductor chips 36 and 37. The electrode portions provided on the principal surfaces of the semiconductor chips 36 and 37 and the inner leads 38 are connected together through bonding wires 39.

These semiconductor chips 36 and 37, the inner leads 38, and the bonding wires 39 are sealed in sealing resin 40 to form a package. Substantially L-shaped outer leads 41, which are formed by extending the inner leads 38, are provided on the four sides of the package so that the outer leads 41 protrude from the four sides.

Figure 6:
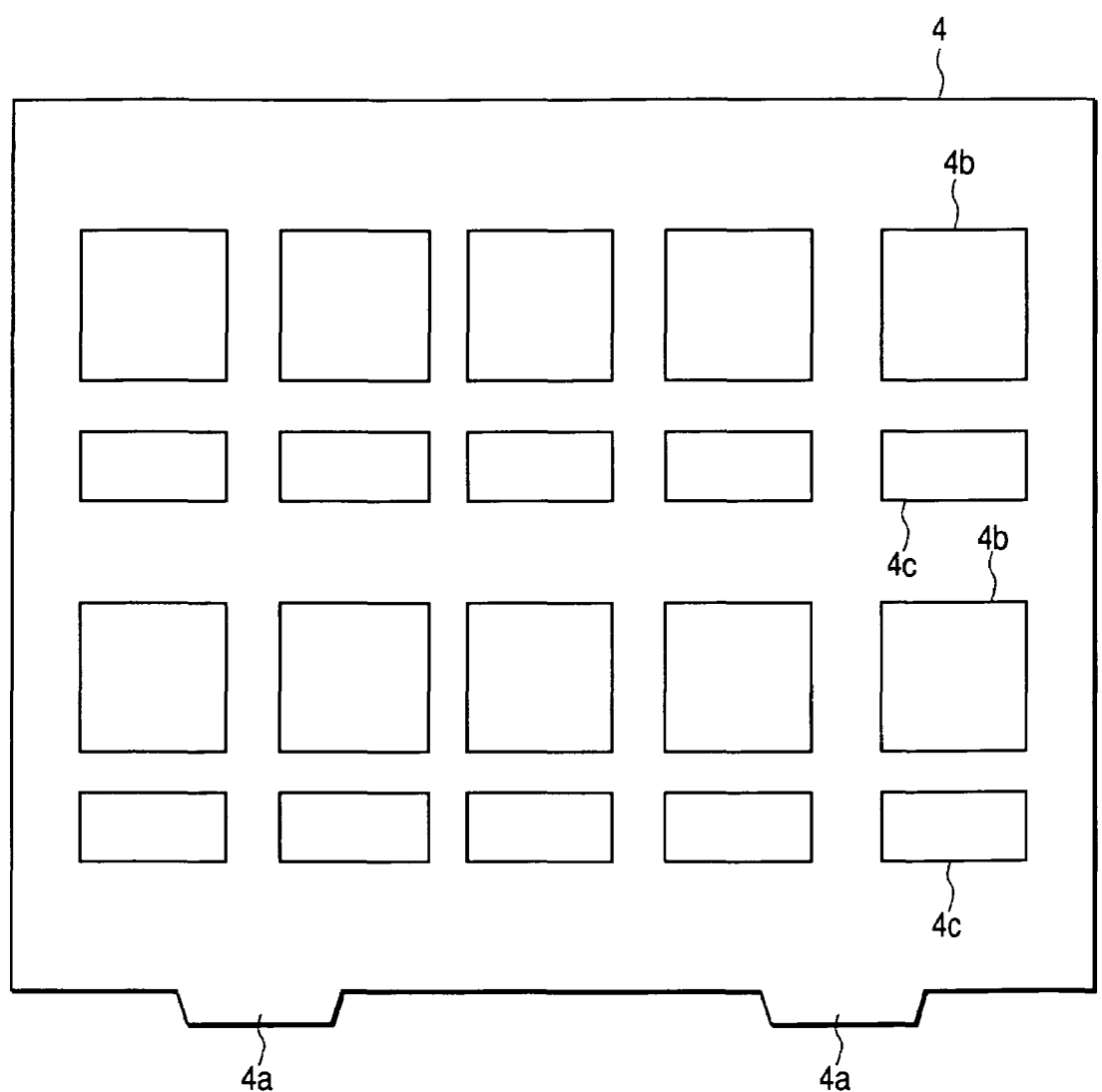
FIG. 6 is a diagram illustrating an example of the contour of a test board connected with the test burn-in system in FIG. 1.

FIG. 6 is diagram illustrating an example of the contour of the test board 4. As illustrated in FIG. 6, the test board 4 is provided on its lower edge with board edge connectors 4a. The board edge connectors 4a are connectors to be connected to a slot 3 provided in the mother board 2.

The test board 4 is mounted with about 10 sockets 4b for measurement for receiving semiconductor integrated circuit devices 20, and each socket 4b for measurement is provided at its lower part with a peripheral circuit 4c in correspondence with the socket 4b for measurement.

Figure 7:
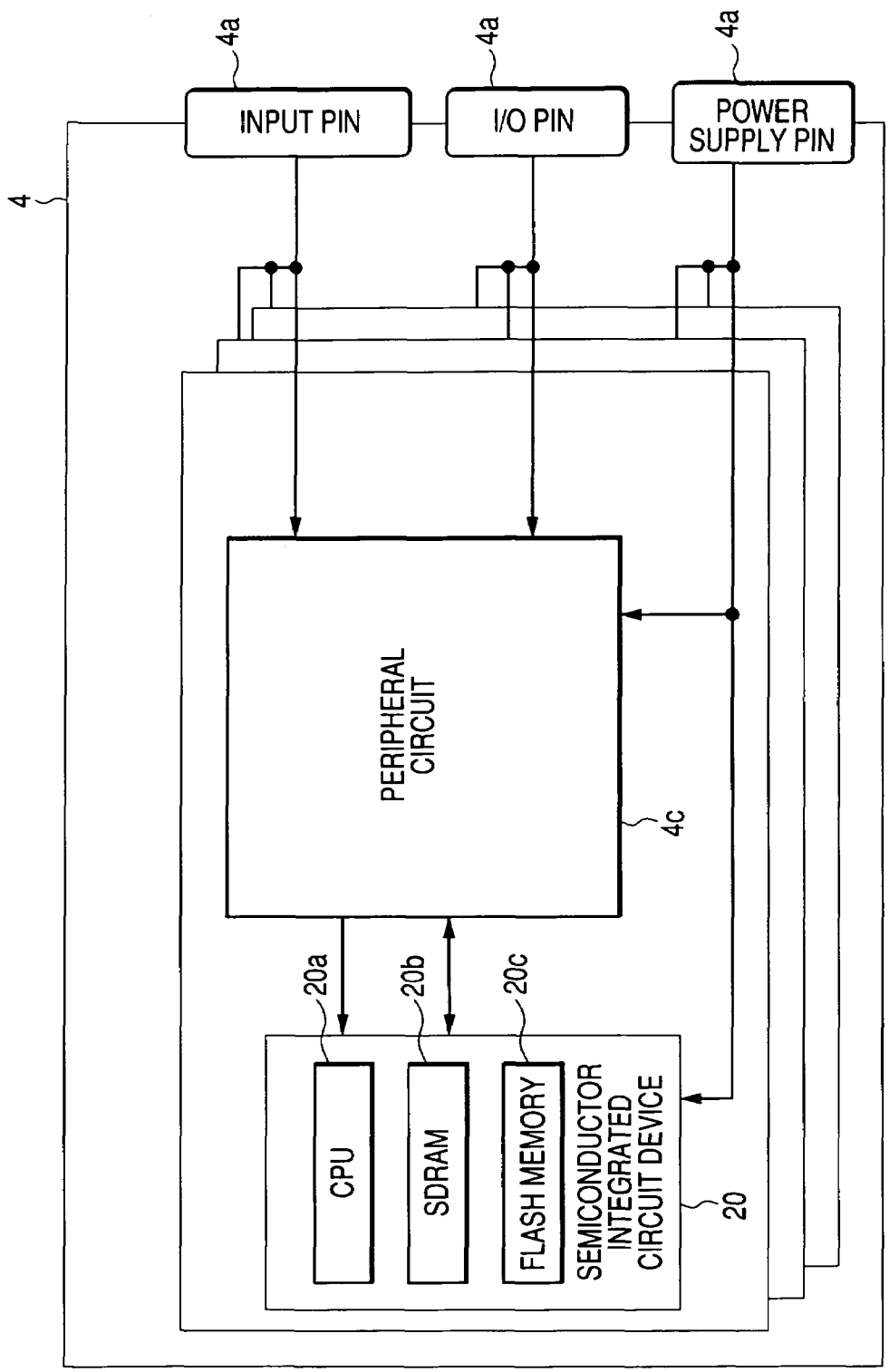
FIG. 7 is a block diagram illustrating the constitution of the test board in FIG. 6.

FIG. 7 is a block diagram illustrating the constitution of the test board 4 in FIG. 6. FIG. 7 depicts a semiconductor integrated circuit device 20 embedded in a socket 4b for measurement in a test board 4 and a peripheral circuit 4c corresponding to the semiconductor integrated circuit device 20.

The peripheral circuit 4c is supplied with signals for testing that are outputted from a back board 5 through the board edge connectors 4a and with various supply voltages generated by a power supply board 6. Various supply voltages generated by the power supply board 6 are also supplied to the semiconductor integrated circuit device 20 through the board edge connectors 4a. The peripheral circuit 4c converts the voltage level, gives instructions associated with testing, and stores the result of testing and the like at the end of a test.

The semiconductor integrated circuit device 20 comprises a CPU 20a operating as a microcomputer, a SDRAM 20b, and a flash memory 20c. The SDRAM 20b and the flash memory 20c are tested by the BIST of the CPU 20a based on signals for testing and the like that are inputted and outputted through the peripheral circuit 4c.

Figure 8:
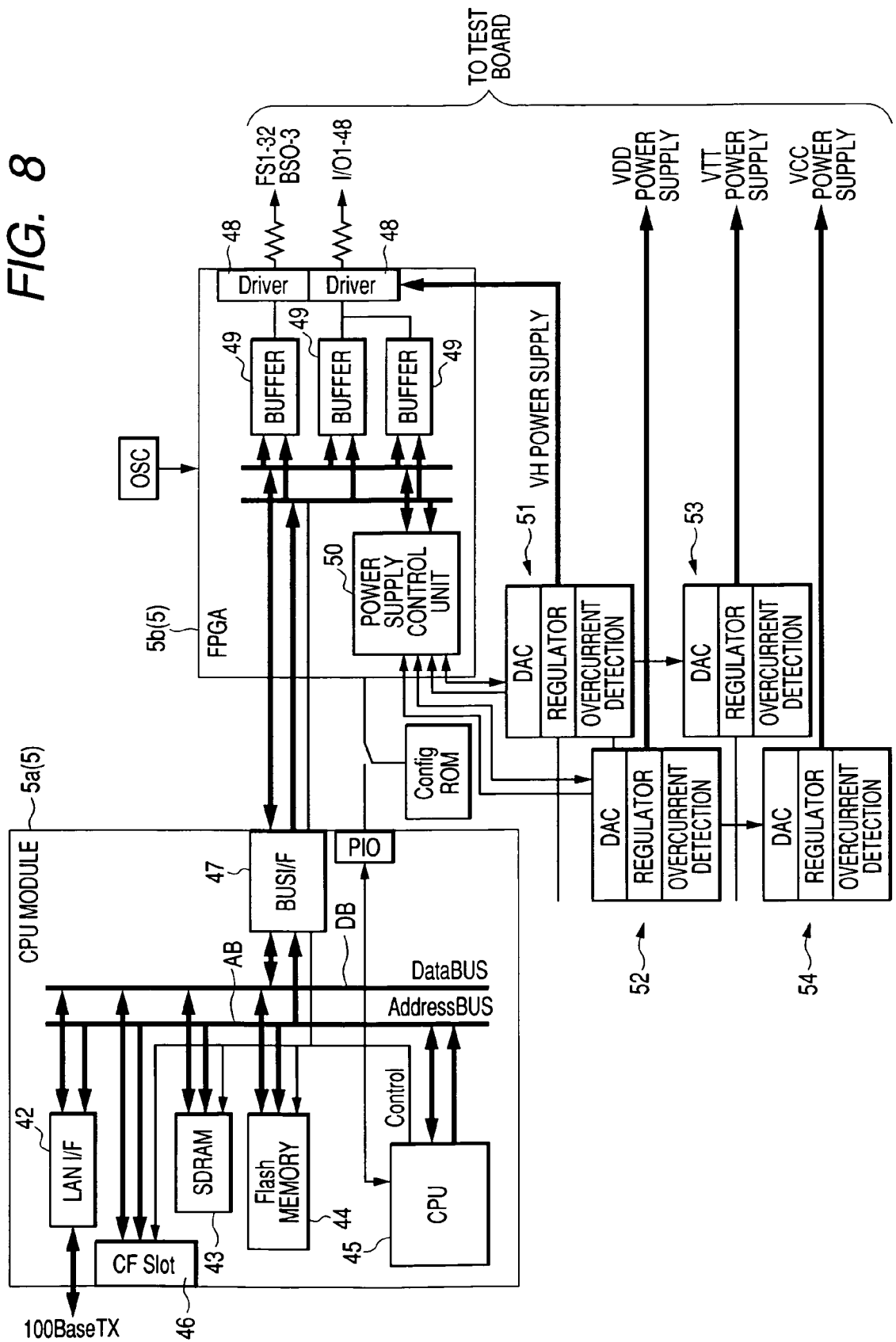
FIG. 8 is a block diagram illustrating the circuitry of the back board and power supply board provided in the test burn-in system in FIG. 1.

FIG. 8 is a block diagram illustrating the circuitry of the back board 5 and the power supply board 6. The back board 5 is mounted with a CPU module 5a and a FPGA 5b.

The CPU module 5a comprises an LAN interface 42, a SDRAM 43, a flash memory 44, a CPU 45, a CF slot 46, a bus interface 47, and the like. The LAN interface 42, SDRAM 43, flash memory 44, CPU 45, CF slot 46, and bus interface 47 are connected with one another through an address bus AB and a data bus DB.

The LAN interface 42 is an interface that has the control terminal 9 (FIG. 1) as a host. The SDRAM 43 is the work area for the CPU 45. The flash memory 44 holds a boot program and the like. The CF slot 46 is the slot for a CF (Compact Flash) card, which holds programs booted to the flash memory 44. The CPU 45 controls the corresponding test board 4 according to the programs stored in the flash memory 44. The bus interface 47 is an interface with external buses, and the FPGA 5b is connected with the interface.

The FPGA 5b comprises: drivers 48 connected with the input pin and I/O pin of the board edge connectors 4a, buffers 49 connected with the drivers, a power supply control unit 50, and the like. The power supply control unit 50 controls the supply voltages generated by the power supply board 6 according to instructions from the control terminal.

The power supply board 6 is provided with four power supply generating units 51 to 54. The power supply generating unit 51 generates a supply voltage to be supplied to the drivers in the FPGA 5b. The power supply generating units 52 to 54 respectively generate three different supply voltages to be supplied to a semiconductor integrated circuit device 20 and the like.

Each of the power supply generating units 51 to 54 is provided with a D-A (Digital-Analog) converter, a regulator, and an overcurrent detection unit. The D-A converters convert control signals outputted from the power supply control unit 50 into analog values. The regulators generate arbitrary supply voltages based on analog values outputted from the D-A converters. The overcurrent detection units output a detection signal when they detect an overcurrent.

Next, a description will be given of the test technique using the test burn-in system 1 in accordance with this embodiment.

First, the operation of the handler 10 in FIG. 2 will be described.

FIG. 9 is a table showing the outline of the specifications of the test burn-in system 1 and the handler 10.

FIG. 9 shows an overview of the specifications with respect to the following items: the set temperature of the thermostatic bath, the temperature accuracy, increments of temperature, the categories of trays, the slot pitch, the cooling method for the test boards 4, the constitution of the thermostatic bath, the minimum test time, the method for supplying untested articles, and the test board 4 ID recognition.

First, semiconductor integrated circuit devices 20 are supplied in a tray, and the semiconductor integrated circuit devices 20 are mounted in a test board 4 by the loader/unloader 13. Test boards 4 mounted with semiconductor integrated circuit devices 20 are supplied one by one to empty portions in the thermostatic bath of the test burn-in system 1 through the elevator 14.

Test boards 4 newly mounted with semiconductor integrated circuit devices 20 are loaded and unloaded while other test boards 4 are under test. Therefore, the port openings for test boards 4 in the test burn-in system 1 are so constituted that their doors are opened on a slot-by-slot basis. Alternatively, thermostatic baths which accommodate one test board 4 may be prepared to provide a required number of slots.

Test boards 4 that underwent a test are cooled and recovered one by one through use of the elevator. Subsequently, individual semiconductor integrated circuit devices 20 are sorted into groups, including non-defectives, defectives, and untested articles, by the loader/unloader 13 according to the test result. The semiconductor integrated circuit devices 20 are placed in corresponding trays: the non-defective tray 17, the defective tray 18, or the untested tray 19.

In this example, a loader and an unloader are integrated into one to enhance the space efficiency. Alternatively, a loader and an unloader may be separately constituted. The test boards 4 are provided with ID by, for example, barcode. This ID is used for various purposes. For example, it is used for the loader/unloader 13 to check test boards against their test results when sorting them out. Further, the ID is used as follows: the system holds such information that a specific socket for measurement in a specific test board 4 is defective. The system does not embed a product in that socket for measurement.

Next, a description will be given of the constitution of the test burn-in system 1 illustrated in FIG. 1.

The major items of testing conducted by the test burn-in system 1 include: memory test on a semiconductor memory (SDRAM, flash memory, etc.) by BIST utilizing the microcomputer mounted in each semiconductor integrated circuit device 20; writing customer data into the flash memory; a burn-in test on microcomputers and memory portions; and the like.

The tester functions are dedicated to BIST. Signals to test boards 4 are generated on a back board 5-by-back board 5 basis, and test conclusions from the test boards 4 are processed. A dedicated ALPG (ALgorithmic Pattern Generator), TG (Timing Generator), address scrambler, or the like is not equipped, and the test program is written in C language.

The clock signal (66 MHz or so) for the actual operation of semiconductor integrated circuit devices 20 is generated by the BIST of each semiconductor integrated circuit device 20. The BIST tester only transfers programs and gives test conclusions at 1 MHz or so. Therefore, the timing accuracy may be disregarded.

FIG. 10 is a table illustrating the outline of the tester functions of the test burn-in system 1. In FIG. 10, the upper part of the table lists items related to the functions of the CPU module 5a mounted in the back board 5. The lower part lists the items related to the functions of the control terminal 9.

Next, a description will be given to a memory test technique using the test burn-in system 1.

FIG. 11 is a diagram illustrating the overview of a memory test with the test burn-in system 1.

Test boards 4 mounted with semiconductor integrated circuit devices 20 are placed in sequence in the thermostatic bath. When a predetermined temperature is reached, the memory test is started. The test time required for this memory test is, for example, about ten minutes to several tens of minutes or so.

After the completion of the memory test, the test board 4 is cooled. Subsequently, the semiconductor integrated circuit devices 20 are sorted out into non-defective (PASS), defective (FAIL), or untested categories by the handler 10 according to the test result, and they are discharged. The number of test boards the thermostatic bath can accommodate is, for example, 24 or so. The test boards 4 are taken one by one into and out of the thermostatic bath.

The temperature of the thermostatic bath can be set over the range of low temperature to ordinary temperature to high temperature. The setting range of low temperature is, for example, between about −50° C. and about 0° C., more widely, between about −55° C. and about 10° C. At these low temperatures, semiconductor integrated circuit devices for use in electronic systems for automobiles and the like are tested.

Tests at ordinary temperature are conducted at room temperature of about 25° C., and the setting range of ordinary temperature is more widely between about 15° C. and about 40° C. The temperature setting for high-temperature tests is about 125° C., and the setting range is, more widely, between about 90° C. and about 150° C.

Figure 12:
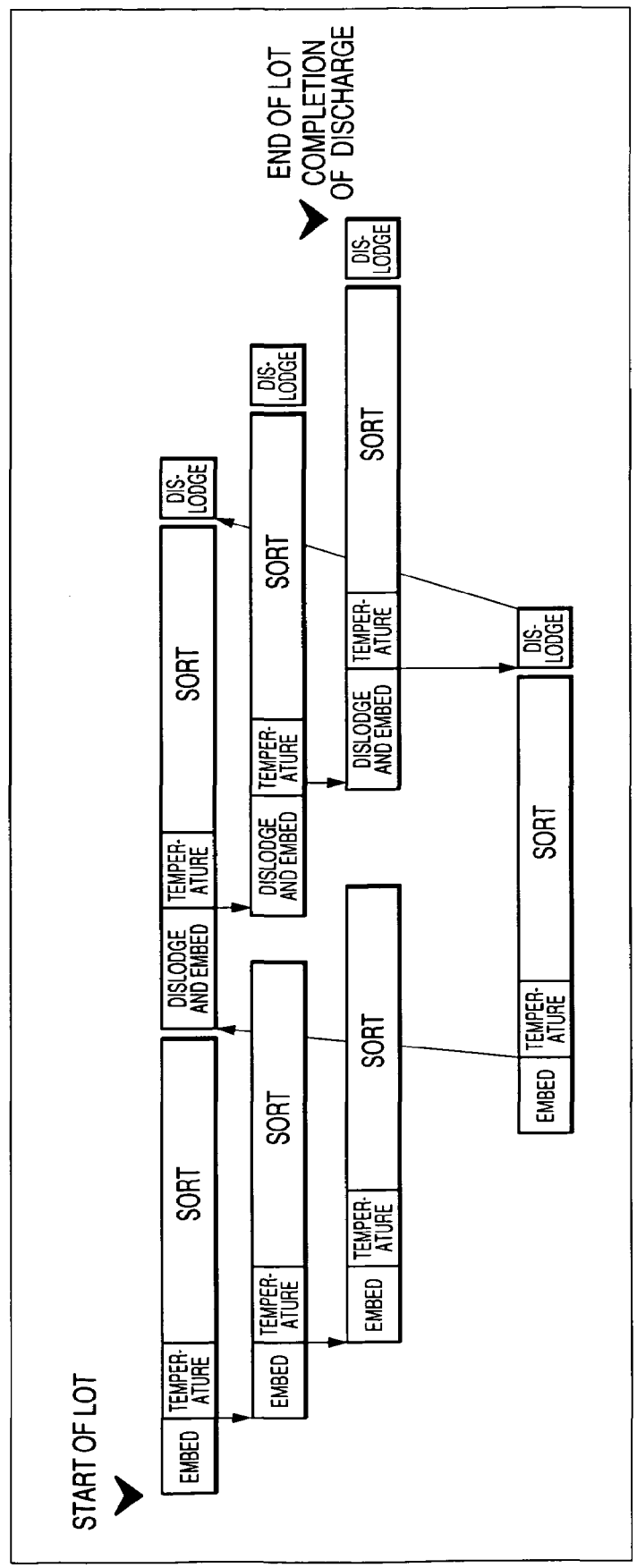
FIG. 12 is a time chart illustrating a test sequence in the test burn-in system in FIG. 1.

FIG. 12 is a time chart illustrating a test sequence in the test burn-in system 1.

First, about 10 semiconductor integrated circuit devices 20 are attached to the sockets 4b for measurement in the first test board 4 (Embed). After the completion of attachment of the semiconductor integrated circuit devices 20, the test board 4 is taken into the thermostatic bath. After the temperature of the thermostatic bath reaches a predetermined value (Temperature), a memory test is started (Sort).

When the memory test is completed, the test board 4 is cooled, and the semiconductor integrated circuit devices 20 are dislodged from the sockets 4b for measurement by the handler 10. Then, new semiconductor integrated circuit devices 20 to be tested are attached to the sockets 4b for measurement in the test board 4 (Dislodge and embed). Thereafter, the test board 4 is taken into the thermostatic bath. After the predetermined temperature is reached (Temperature), a memory test is conducted (Sort).

With respect to the second test board 4, the following procedure is carried out: when the attachment of semiconductor integrated circuit devices 20 to the first test board 4 is completed, semiconductor integrated circuit devices 20 are attached to the second test board 4 without a break (Embed). Like the first test board 1, after the completion of attachment of the semiconductor integrated circuit devices 20 is completed, the second test board 4 is taken into the thermostatic bath. After the predetermined temperature is reached (Temperature), a memory test is started (Sort).

When the memory test is completed, the test board 4 is cooled and then the semiconductor integrated circuit devices 20 are dislodged from the sockets for measurement by the handler 10. Then, semiconductor integrated circuit devices 20 to be tested are attached to the test board 4 again (Dislodge and embed). With respect to the third to 24th test boards 4, the memory test is conducted with the same cycle.

Thus, the 24 test boards 4 are processed in sequence with time differences, and the individual test boards 4 are circulated one by one. This is the sequence of single board processing: the test is started with a test board 4 in which semiconductor integrated circuit devices 20 have been embedded; and semiconductor integrated circuit devices 20 are discharged, beginning with a test board 4 that has undergone the test. "Single board processing" refers to processing wherein test boards 4 are subjected to a memory test one by one. However, it should be noted that a plurality of test boards are simultaneously processed in the whole test. That is, placement in test equipment, start and end of a test, takeoff, and the like are carried out by single board processing. This does not preclude two or more boards from being simultaneously taken in and processed in a like manner for the sake of the convenience of the system.

Next, detailed description will be given of the test process carried out in the test burn-in system 1 with reference to the flowcharts in FIG. 13 to FIG. 20. Here, a description will be given with attention focused on a slot in the test burn-in system 1; however, the test process described below is also carried out in the other slots.

Figure 13:
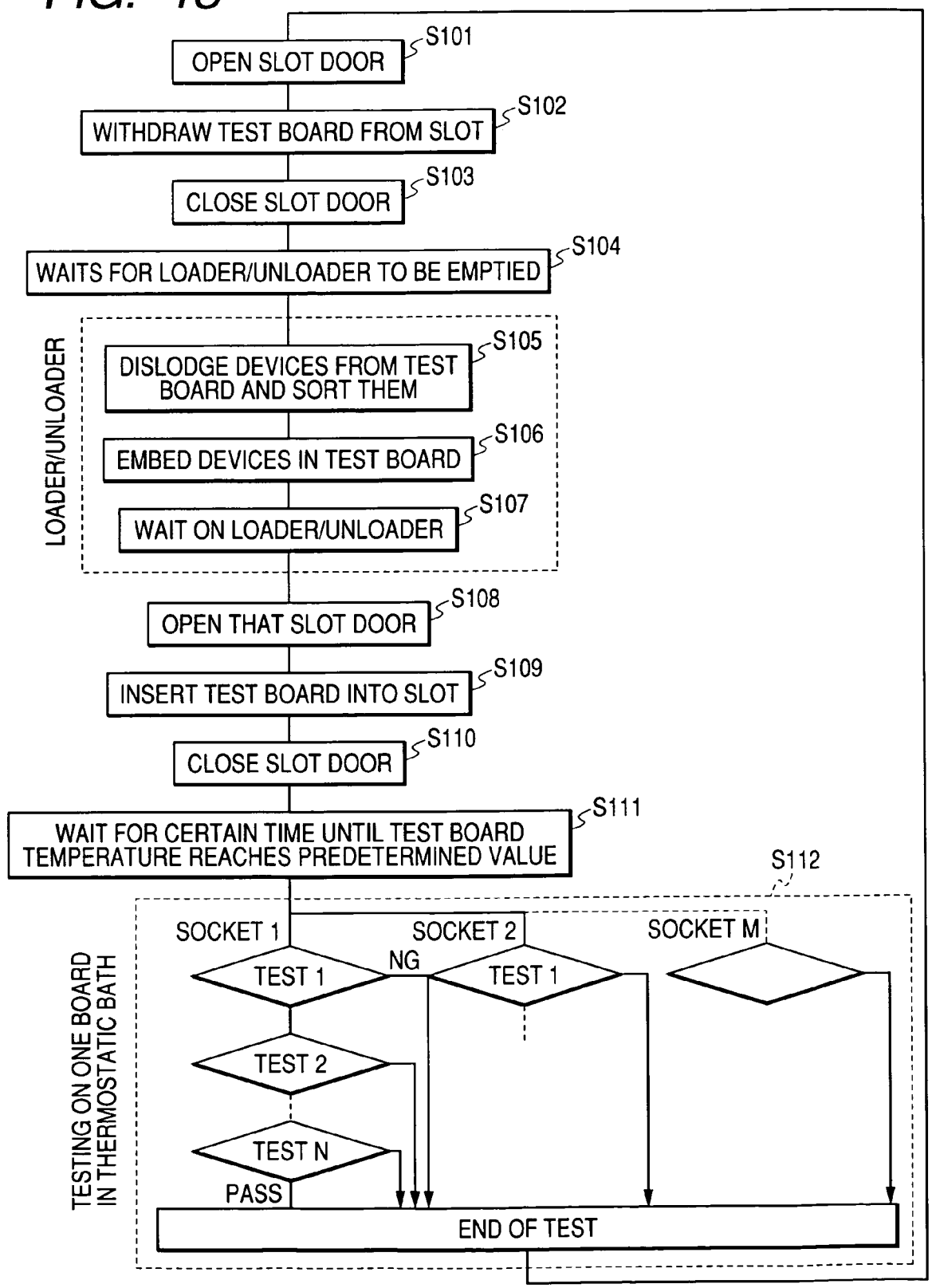
FIG. 13 is a detailed flowchart illustrating an example of a memory test using a test burn-in system and a handler.
Figure 14:
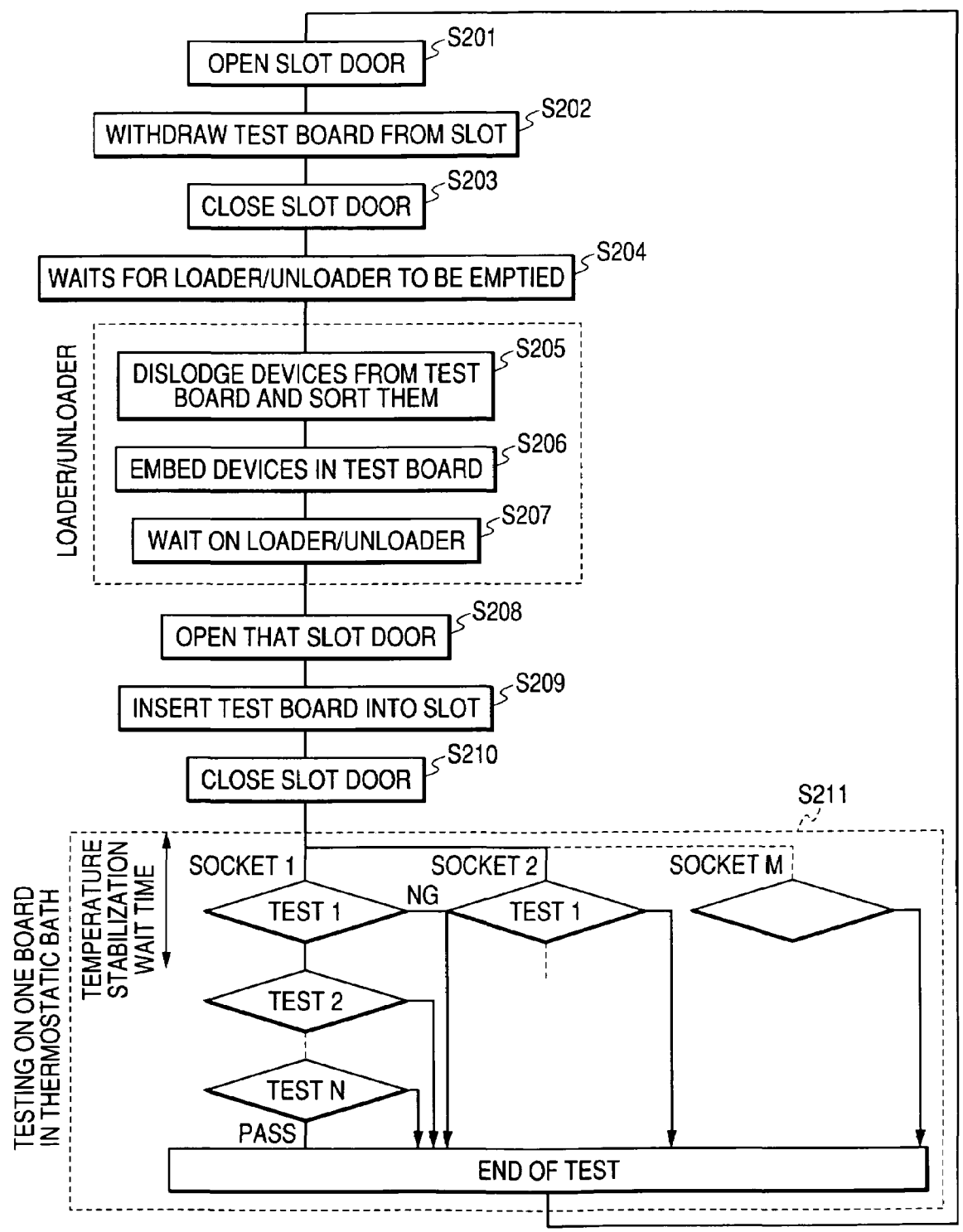
FIG. 14 is a detailed flowchart illustrating another example of a memory test using a test burn-in system and a handler.

FIG. 13 and FIG. 14 are flowcharts illustrating examples of the test process where the number of the slots in the test burn-in system 1 is identical with the number of test boards 4.

First, a description will be given with reference to FIG. 13, which illustrates the test process where the elevator 12 is used as a buffer and test boards 4 are caused to wait there until the loader/unloader 13 is emptied.

First, the door to a slot in which testing has been completed is opened (Step 101), and the test board 4 is withdrawn from the slot (Step 102). Then the slot door is closed (Step 103).

Subsequently, the test board 4 waits on the elevator 12 until the loader/unloader 13 is emptied (Step 104). Then, the handler 10 dislodges the semiconductor integrated circuit devices 20 from the test board 4 and sorts them out according to the test result (Step 105).

After the semiconductor integrated circuit devices 20 are dislodged, the test board 4 is mounted with semiconductor integrated circuit devices 20 to be newly tested (Step 106). The test board 4 waits on the loader/unloader 13 (Step 107).

Thereafter, the door to the slot from which the test board was withdrawn during the processing of Step 102 is opened (Step 108). The test board 4 is inserted into the slot (Step 109), and then the slot door is closed (Step 110).

The operation waits until the temperature of the test board 4 inserted during the processing of Step 109 reaches a preset temperature (Step 111). When the preset temperature is reached, a memory test is conducted (Step 112).

In the memory test, test 1 to test N are conducted on the M semiconductor integrated circuit devices 20 mounted in the test board 4 in parallel. When all of the tests are completed, a flag indicating the completion of the test is outputted from the test board 4. Based on the flag, the back board 5 detects the completion of the test and notifies the control terminal 9 of that. Thereafter, the processing of Steps 101 to 112 is repeated.

The time of the memory test conducted at Step 112 significantly varies depending on the following: a difference in the time of writing into/erasing from the memory portion caused by variation in the manufacture of semiconductor integrated circuit devices 20; the number of semiconductor integrated circuit devices that fail in testing; and the like.

For example, if there is even one semiconductor integrated circuit device 20 that takes a very long write/erase time, the test time is governed by the semiconductor integrated circuit device 20 and is lengthened. If all of the semiconductor integrated circuit devices 20 mounted in a test board 4 fail in test 1, or in the first test, the memory test is terminated at that point of time. In this case, the test time is significantly reduced.

Thus, the test time varies from test board 4 to test board 4 inserted in each slot. To cope with this, the processing of Steps 101 to 112 is performed on a slot-by-slot basis.

Next, a description will be given regarding the test process illustrated in FIG. 14. FIG. 14 illustrates an example of the test process in which the following procedure is taken: the elevator 12 is used as a buffer, and test boards 4 are caused to wait there until the loader/unloader 13 is emptied. At the same time, tests irrelevant to temperature are conducted until the temperature of the test board 4 in the slot is stabilized.

First, the door to a slot in which testing has been completed is opened (Step 201), and the test board 4 is withdrawn from the slot (Step 202). Then the slot door is closed (Step 203). Subsequently, the test board 4 waits on the elevator 12 until the loader/unloader 13 is emptied (Step 204). Then, the handler 10 dislodges the semiconductor integrated circuit devices 20 from the test board 4, and it sorts them out according to the test result (Step 205).

Thereafter, the test board 4 is mounted with semiconductor integrated circuit devices 20 to be newly tested (Step 206) and waits on the loader/unloader 13 (Step 207). Thereafter, the door to the slot closed during the processing of Step 202 is opened (Step 208), and the test board 4 is inserted into the slot (Step 209). Then, the slot door is closed (Step 210).

The operation waits until the temperature of the slot with the test board 4 inserted therein reaches a preset value, and then a memory test is conducted (Step 211). The processing of Step 211 is performed as follows: temperature setting is started, and tests irrelevant to temperature are conducted until the temperature is stabilized at the set value. Thus, the tests can be efficiently conducted.

When the memory test is completed, a flag indicating the completion of the test is outputted from the test board 4. Based on the flag, the back board 5 detects the completion of the test and notifies the control terminal 9 of that. Thereafter, the processing of Steps 201 to 211 is repeated.

FIG. 15 to FIG. 20 are flowcharts illustrating the test process where the number of test boards 4 is larger than the number of the slots in the test burn-in system 1 by one or two.

Figure 15:
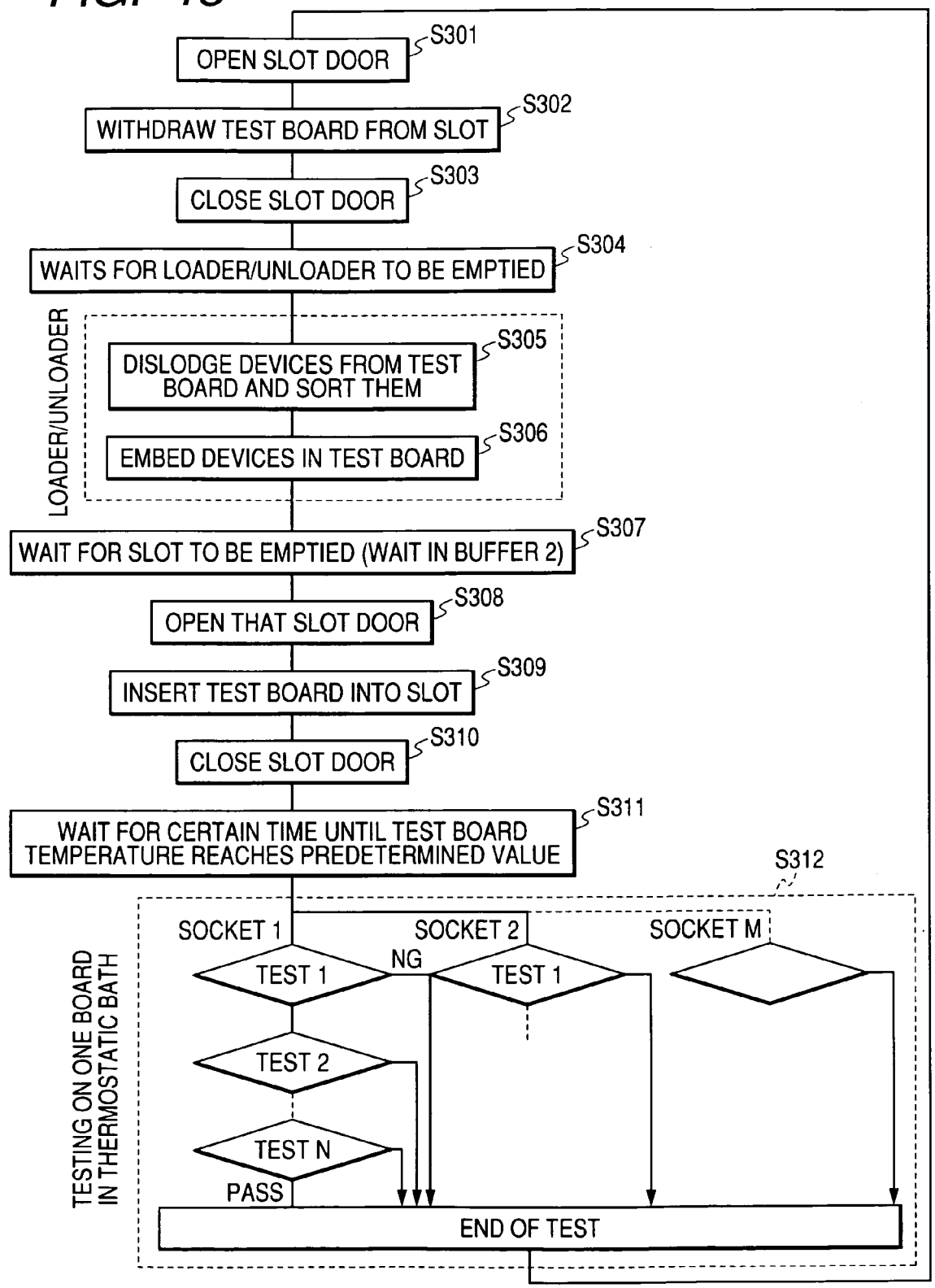
FIG. 15 is a detailed flowchart illustrating an example of a memory test using a test burn-in system and a handler.

First, a description will be given with reference to FIG. 15, which illustrates the test process where the following procedure is taken: the elevator 12 is used as buffer 1, and a wait area (not shown) provided between the loader/unloader 13 and the elevator 14 is used as buffer 2. Test boards 4 are caused to wait there until the loader/unloader 13 is emptied. Thus, new test boards 4 to be put to the test can be efficiently prepared, and the test efficiency can be further enhanced.

First, the door to a slot in which testing has been completed is opened (Step 301), and the test board 4 is withdrawn from the slot (Step 302). Then, the slot door is closed (Step 303).

Subsequently, the test board 4 waits on the elevator 12 until the loader/unloader 13 is emptied (Step 304). Then, the handler 10 dislodges the semiconductor integrated circuit devices 20 from the test board 4, and sorts them out according to the test result (Step 305).

Thereafter, the test board 4 is mounted with semiconductor integrated circuit devices 20 to be newly tested (Step 306), and it waits in the wait area (Step 307) until any slot is emptied.

When any slot is emptied, the door to that slot is opened (Step 308), and the test board 4 is inserted into the slot (Step 309). Then, the slot door is closed (Step 310).

The operation waits until the temperature of the test board 4 inserted during the processing of Step 309 reaches a preset value (Step 311). When the temperature reaches the preset value, a memory test is conducted (Step 312).

Figure 16:
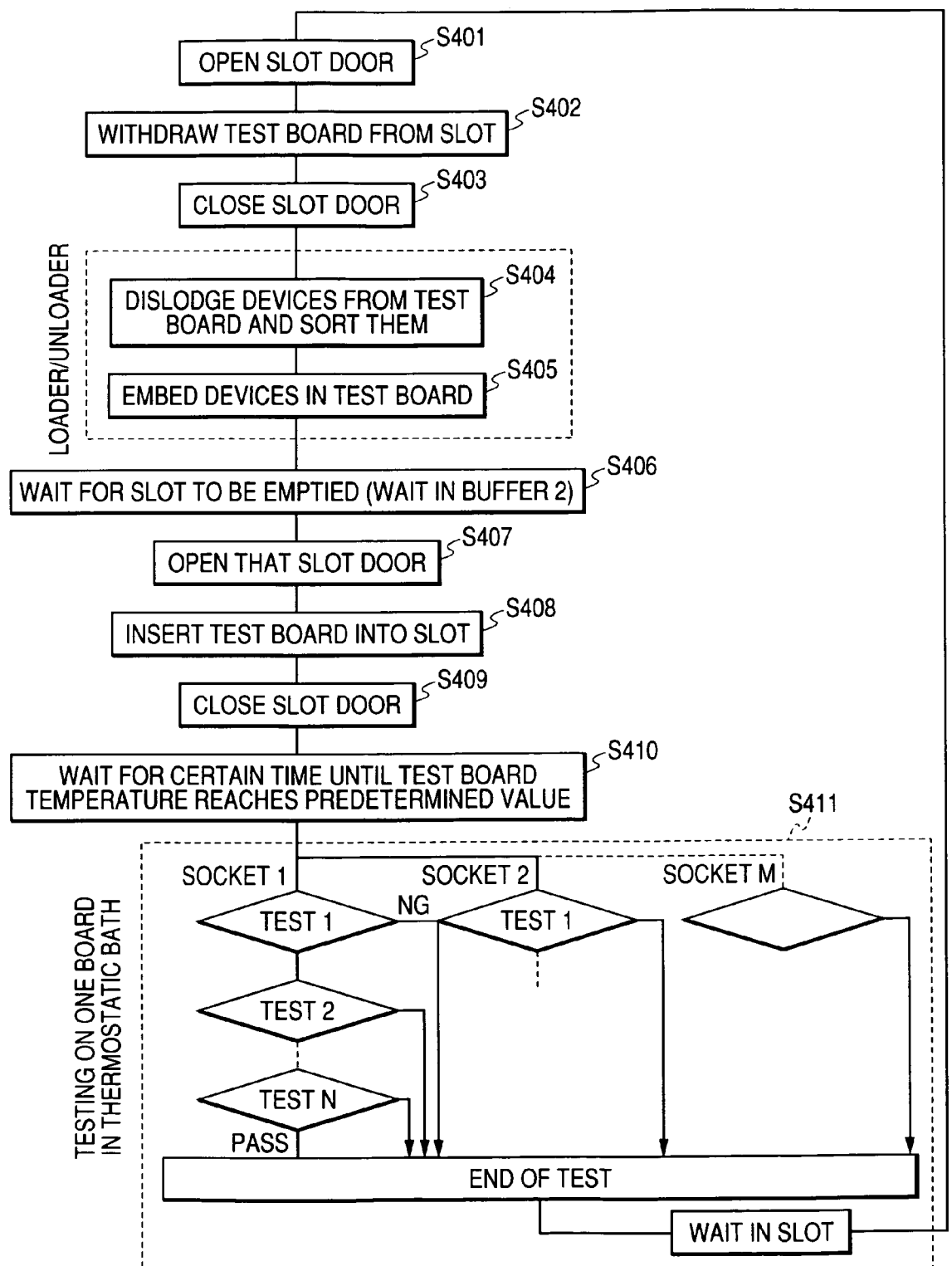
FIG. 16 is a detailed flowchart illustrating another example of a memory test using a test burn-in system and a handler.

Next, a description will be given regarding the test process illustrated in FIG. 16. FIG. 16 illustrates another example of the test process where the following procedure is taken: the wait area is only used as a buffer, and test boards 4 are caused to wait there until the loader/unloader 13 is emptied.

First, the door to a slot in which testing has been completed is opened (Step 401), and the test board 4 is withdrawn from the slot (Step 402). Then the slot door is closed (Step 403).

Subsequently, the handler 10 dislodges the semiconductor integrated circuit devices 20 from the test board 4, and it sorts them out according to the test result (Step 404). Thereafter, the test board 4 is mounted with semiconductor integrated circuit devices 20 to be newly tested (Step 405), and it waits in the wait area (Step 406) until any slot is emptied.

When any slot is emptied, the door to that slot is opened (Step 407), and the test board 4 is inserted into the slot (Step 408). Then, the slot door is closed (Step 409).

The operation waits until the temperature of the test board 4 inserted during the processing of Step 408 reaches a preset value (Step 410). When the temperature reaches the preset value, a memory test is conducted (Step 411).

Figure 17:
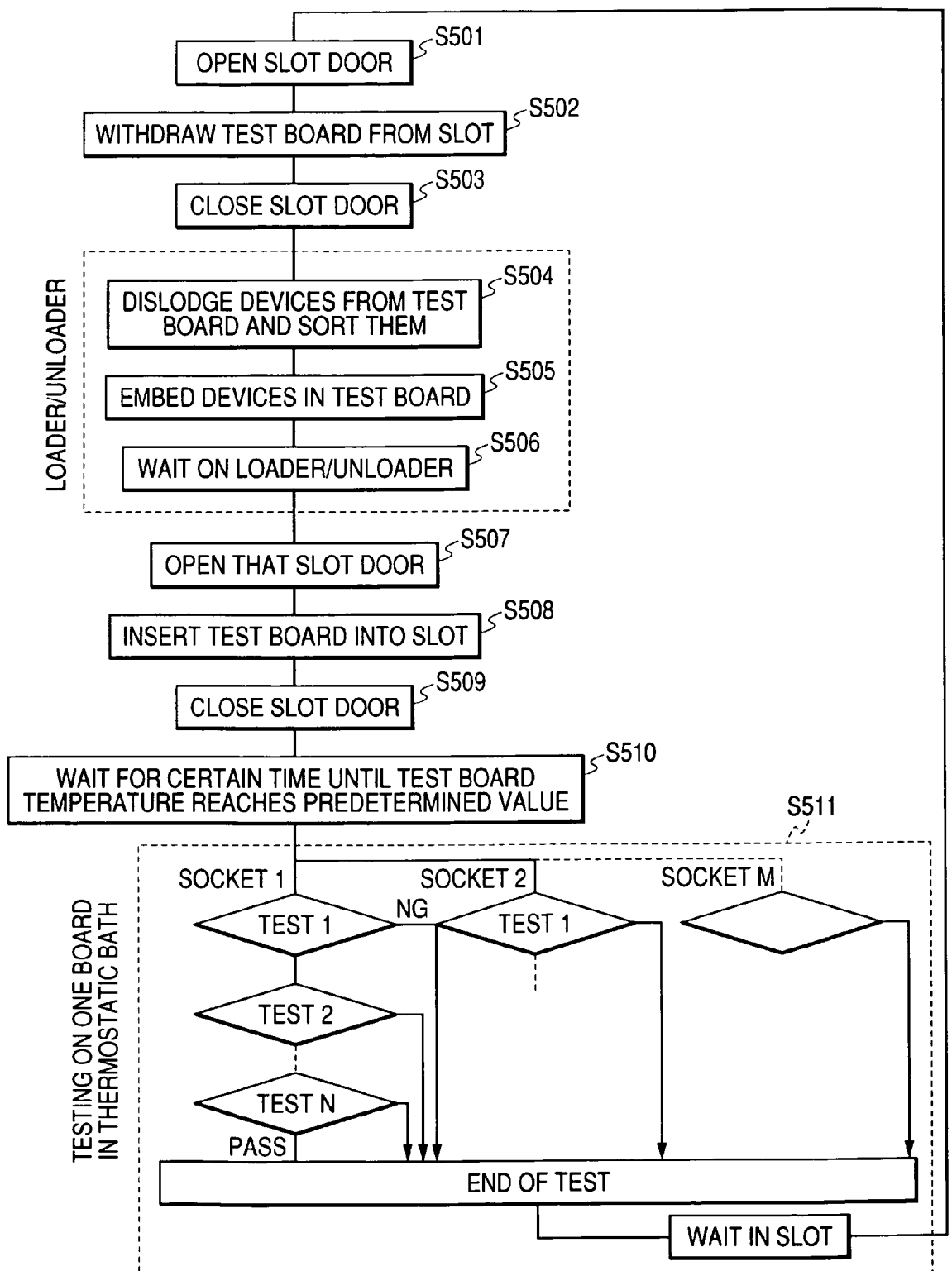
FIG. 17 is a detailed flowchart illustrating an example of a memory test using a test burn-in system and a handler.

Next, a description will be given regarding the test process illustrated in FIG. 17. FIG. 17 illustrates an example of the test process where the following procedure is taken: the elevator 12 or the wait area is not used as a buffer. If the loader/unloader 13 is not empty, test boards 4 are caused to wait in a slot. If there is not an empty slot, test boards 4 are caused to wait on the loader/unloader 13.

First, the door to a slot in which testing has been completed is opened (Step 501), and the test board 4 is withdrawn from the slot (Step 502). Then the slot door is closed (Step 503).

Subsequently, the handler 10 dislodges the semiconductor integrated circuit devices 20 from the test board 4, and it sorts them out according to the test result (Step 504). Subsequently, the test board 4 is mounted with semiconductor integrated circuit devices 20 to be newly tested (Step 505), and it waits on the loader/unloader 13 (Step 506). Then, the door to the slot is opened (Step 507), and the test board 4 is inserted into the slot (Step 508). Thereafter, the slot door is closed (Step 509).

The operation waits until the temperature of the test board 4 inserted during the processing of Step 508 reaches a preset value (Step 510). When the temperature reaches the preset value, a memory test is conducted (Step 511).

Figure 18:
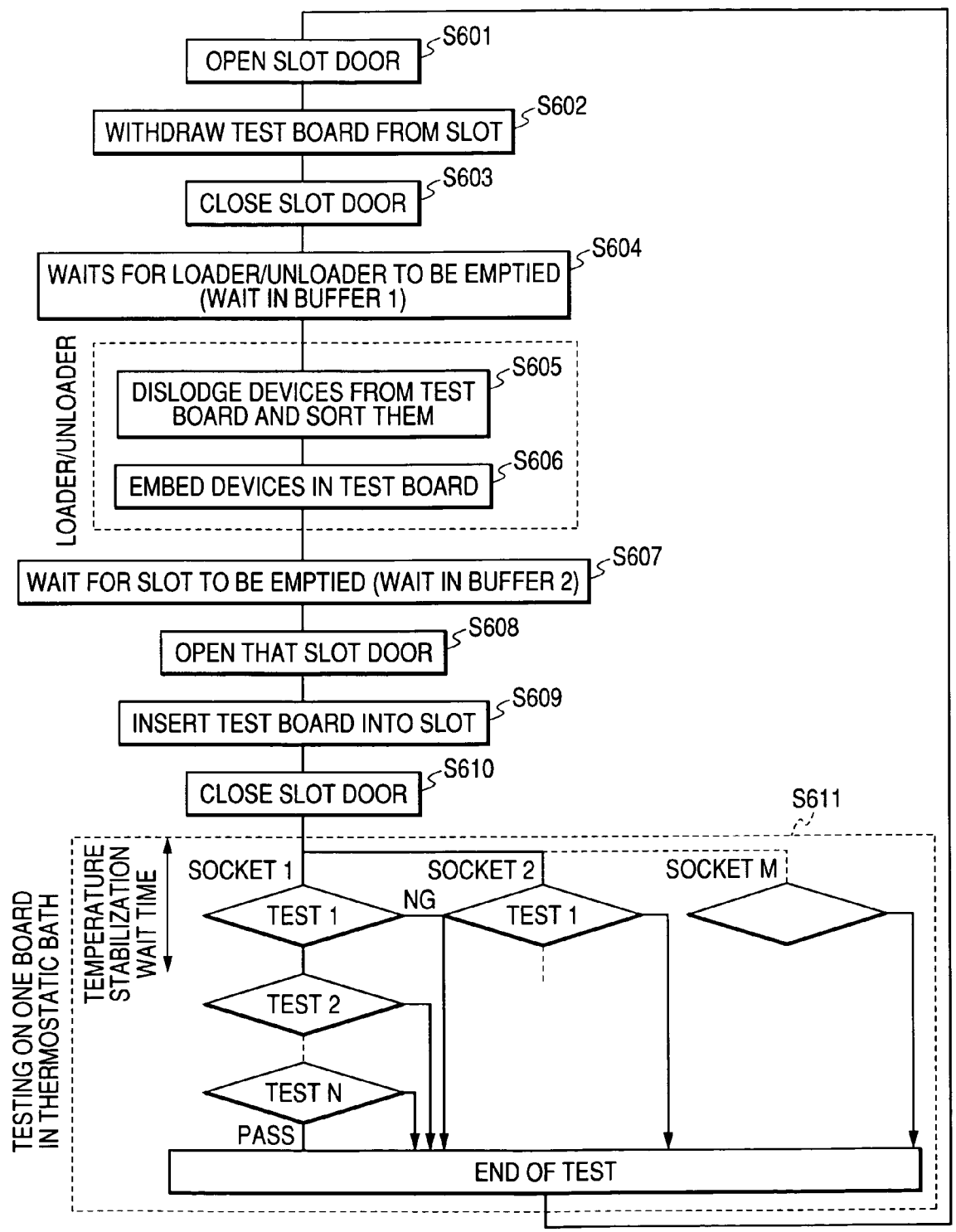
FIG. 18 is a detailed flowchart illustrating another example of a memory test using a test burn-in system and a handler.

Next, a description will be given regarding the test process illustrated in FIG. 18. FIG. 18 illustrates an example of the test process where the following procedure is taken: the elevator 12 and the wait area are used as buffers, and test boards 4 are caused to wait there until the loader/unloader 13 is emptied. At the same time, tests irrelevant to temperature are conducted until the temperature of the test board 4 in the slot is stabilized.

First, the door to a slot in which testing has been completed is opened (Step 601), and the test board 4 is withdrawn from the slot (Step 602). Then the slot door is closed (Step 603).

Thereafter, the test board waits on the elevator 12 (Step 604) until the loader/unloader 13 is emptied. Then, the handler 10 dislodges the semiconductor integrated circuit devices 20 from the test board 4, and it sorts them out according to the test result (Step 605).

Subsequently, the test board 4 is mounted with semiconductor integrated circuit devices 20 to be newly tested (Step 606), and it waits in the wait area until any slot is emptied (Step 607).

When any slot is emptied, the door to that slot is opened (Step 608), and the test board 4 is inserted into the slot (Step 609). Then the slot door is closed (Step 610).

Temperature setting is started with respect to the test board 4 inserted during the processing of Step 609. When the temperature reaches the set value, a memory test is conducted (Step 611). The processing of Step 611 is performed as follows: temperature setting is started, and tests irrelevant to temperature are conducted until the temperature is stabilized at the set value. Thus, the tests can be more efficiently conducted.

Figure 19:
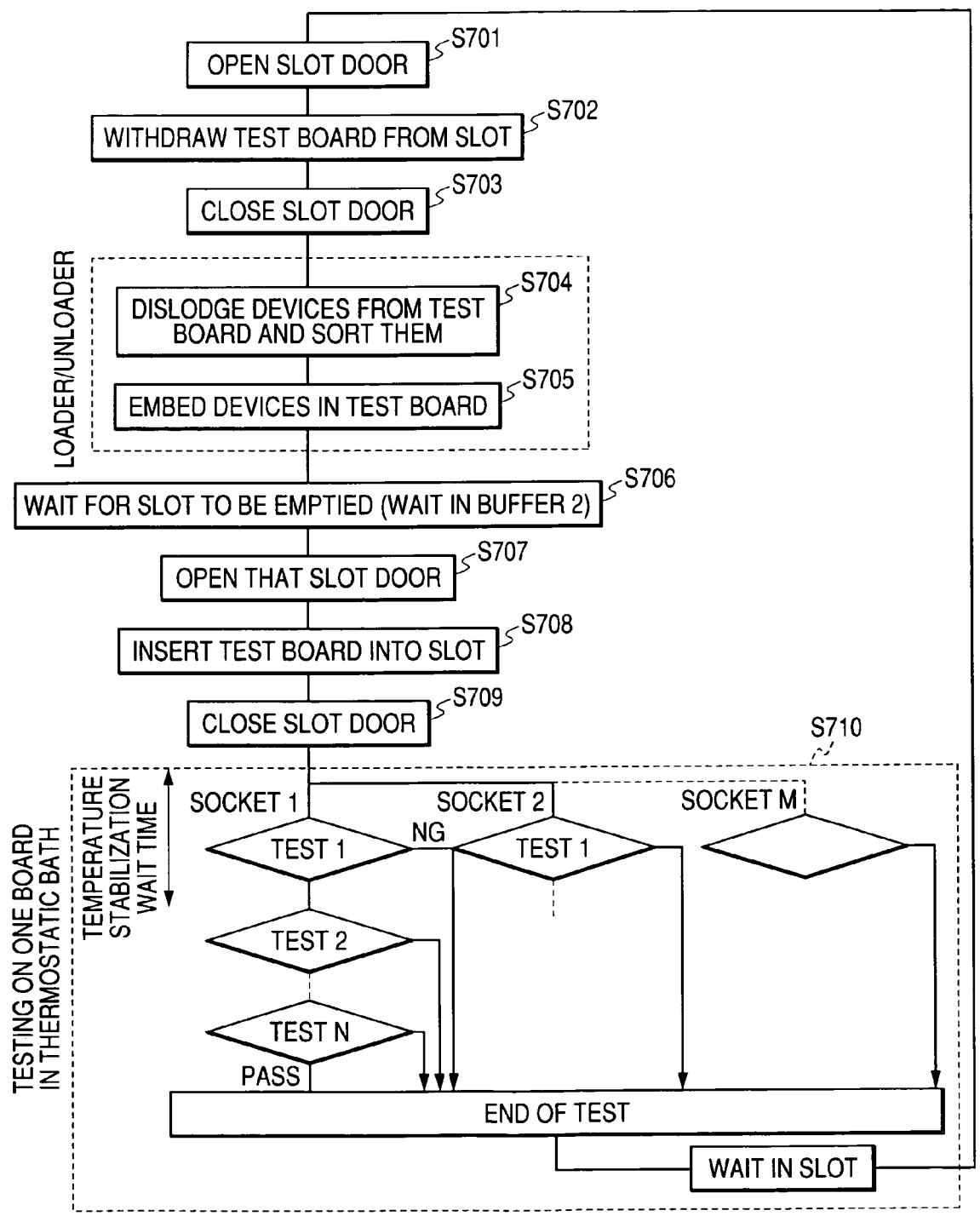
FIG. 19 is a detailed flowchart illustrating an example of a memory test using a test burn-in system and a handler.

Next, a description will be given regarding the test process illustrated in FIG. 19. FIG. 19 illustrates an example of the test process where the following procedure is taken: the wait area is only used as a buffer. If the loader/unloader 13 is not empty, test boards 4 are caused to wait in a slot. If there is not an empty slot, test boards 4 are caused to wait in the wait area until any slot is emptied. At the same time, tests irrelevant to temperature are conducted until the temperature of the test board 4 in the slot is stabilized.

First, the door to a slot in which testing has been completed is opened (Step 701), and the test board 4 is withdrawn from the slot (Step 702). Then the slot door is closed (Step 703).

Subsequently, the handler 10 dislodges the semiconductor integrated circuit devices 20 from the test board 4, and it sorts them out according to the test result (Step 704). Thereafter, the test board 4 is mounted with semiconductor integrated circuit devices 20 to be newly tested (Step 705). The test board 4 waits in the wait area until any slot is emptied (Step 706).

When any slot is emptied, the door to that slot is opened (Step 707), and the test board 4 is inserted into the slot (Step 708). Then the slot door is closed (Step 709).

Temperature setting is started with respect to the test board 4 inserted during the processing of Step 708. When the temperature reaches a preset value, a memory test is conducted, and a test board 4 that has undergone the test waits in the slot (Step 710).

In this case as well, the processing of Step 710 is performed as follows: temperature setting is started, and tests irrelevant to temperature are conducted until the temperature is stabilized at the set value. Thus, the tests can be more efficiently conducted.

Figure 20:
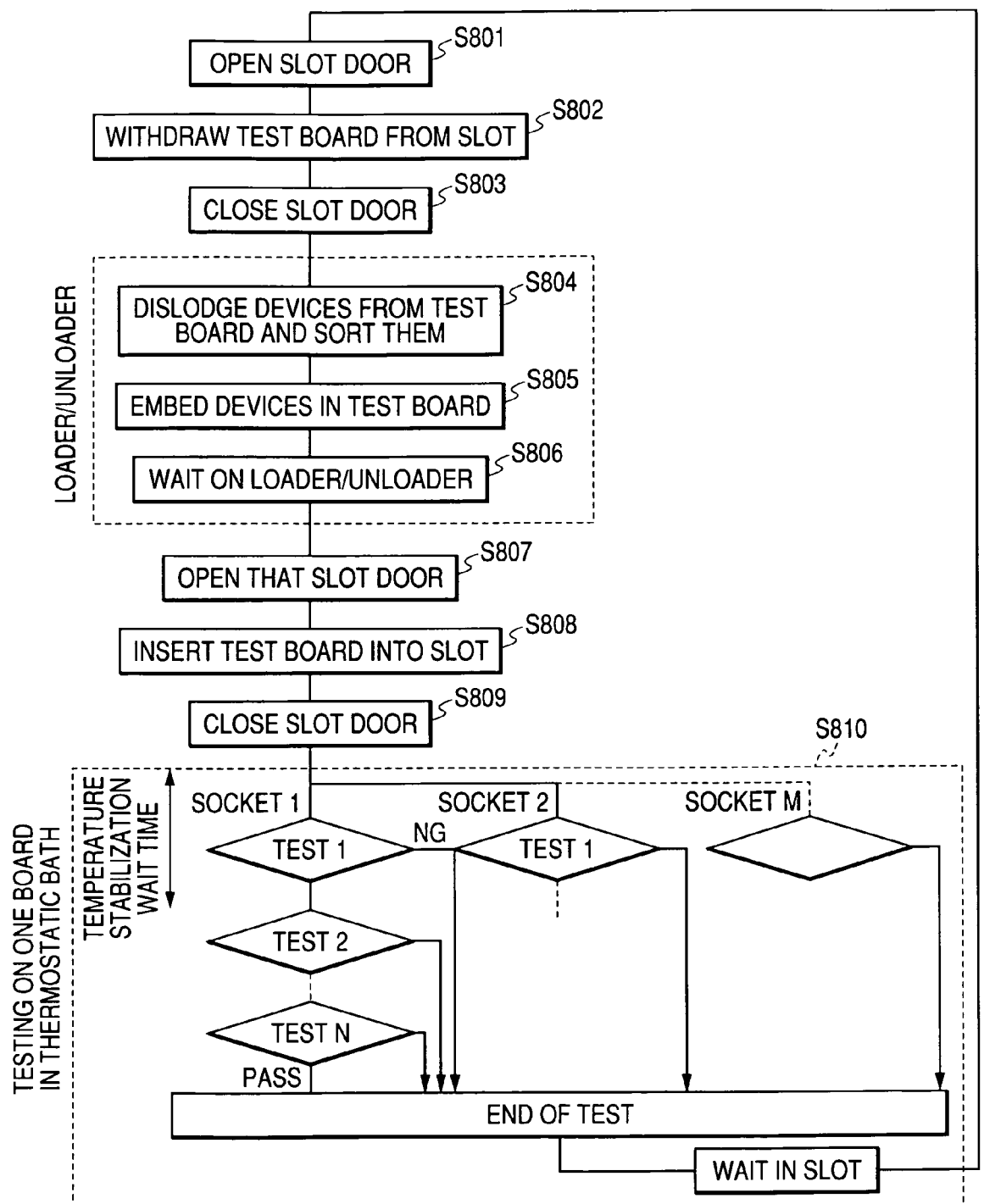
FIG. 20 is a detailed flowchart illustrating another example of a memory test using a test burn-in system and a handler.

Next, a description will be given regarding the test process illustrated in FIG. 20. FIG. 20 illustrates an example of the test process where the following procedure is taken: the elevator 12 or the wait area is not used as a buffer. If the loader/unloader 13 is not empty, test boards 4 are caused to wait in a slot. If there is not an empty slot, test boards 4 are caused to wait on the loader/unloader 13. At the same time, tests irrelevant to temperature are conducted until the temperature of the test board 4 in the slot is stabilized.

First, the door to a slot in which testing has been completed is opened (Step 801), and the test board 4 is withdrawn from the slot (Step 802). Then the slot door is closed (Step 803).

Subsequently, the handler 10 dislodges the semiconductor integrated circuit devices 20 from the test board 4 and sorts them out according to the test result (Step 804). Thereafter, the test board 4 is mounted with semiconductor integrated circuit devices 20 to be newly tested (Step 805). The test board 4 waits on the loader/unloader 13 (Step 806) until any slot is emptied.

When any slot is emptied, the door to that slot is opened (Step 807), and the test board 4 is inserted into the slot (Step 808). Then the slot door is closed (Step 809).

Temperature setting is started with respect to the test board 4 inserted during the processing of Step 808. When the temperature reaches a preset value, a memory test is conducted, and a test board 4 that has undergone the test waits in the slot (Step 810).

In this case as well, the processing of Step 810 is performed as follows: temperature setting is started, and tests irrelevant to temperature are conducted until the temperature is stabilized at the set value. Thus, the tests can be more efficiently conducted.

In the memory test illustrated in FIG. 14 to FIG. 20, test 1 to test N are conducted on the semiconductor integrated circuit devices 20 in parallel as in the memory test illustrated in FIG. 13. When all the tests are completed, a flag indicating the completion of the test is outputted from the test board 4. Based on the flag, the back board 5 detects the completion of the test and notifies the control terminal 9 of that. Thereafter, the processing is repeated from the first step.

In the memory test illustrated in FIG. 14 to FIG. 20, the test time significantly varies depending on the following: a difference in the time of writing into/erasing from the memory portion caused by variation in the manufacture of semiconductor integrated circuit devices 20; the number of semiconductor integrated circuit devices that fails in testing; and the like.

In the examples described with reference to FIG. 13 to FIG. 20, test boards 4 are inserted into slots one by one. Alternatively, two (or three or more) test boards 4 may be simultaneously inserted into slots and be simultaneously withdrawn from the slots, as in so-called double board processing or the like. In this case, however, the effect of reducing the board cost can be lessened and the burden imposed on the handler which transports boards is increased with an increase in the number of boards simultaneously inserted/withdrawn. Therefore, single board processing is more advantageous in terms of the cost of the handler. The upper limit of the number N of boards is possibly N=4 or so; however, it should be preferably two or less.

Boards may be initially inserted in sequence from the top down (or from bottom up); however, the order of insertion is not limited to this. For example, boards may be inserted at random.

In this case, as the number of test boards 4 simultaneously inserted is increased, the load on the handler 10 is increased. In addition, disadvantages, such as an increase in test wait time, will result.

Figure 21:
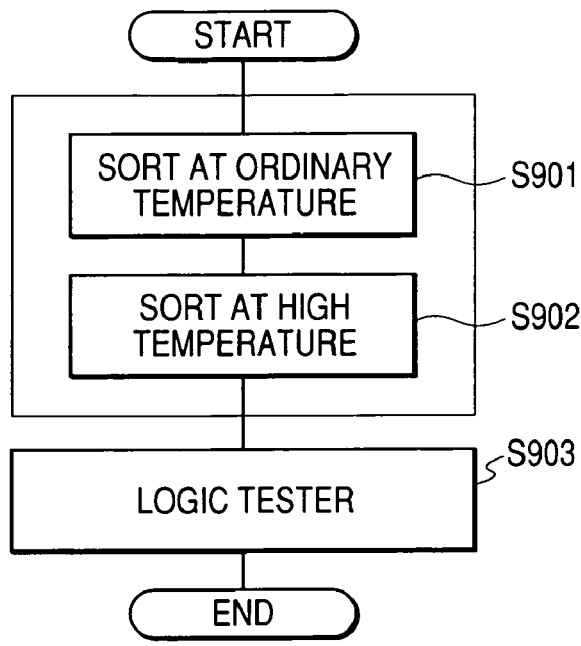
FIG. 21 is a flowchart of a memory test with the test burn-in system in FIG. 1.

FIG. 21 is a flowchart of the memory test with the test burn-in system 1.

FIG. 21 illustrates an example where an ordinary-temperature memory test (sort at ordinary temperature) and a high-temperature memory test (sort at high temperature) are carried out. In the example illustrated in FIG. 21, a burn-in test is carried out separately, for example, prior to the processing of Step 901 to be described later.

If a sort operation at ordinary temperature and a sort operation at high temperature are carried out with the test burn-in system 1, an ordinary-temperature memory test is conducted first (Step 901). Subsequently, a high-temperature memory test is conducted (Step 902). Thereafter, the logic functions and the electrical characteristics of the CPU 20a of semiconductor integrated circuit devices 20 are measured with a logic tester (Step 903).

The processing of Steps 901 and 902 is performed as follows: at Step 901, the memory test is conducted with the test sequence described with reference to FIG. 12; thereafter, at Step 902, the memory test is conducted again with the test sequence described with reference to FIG. 12. That is, the memory test is conducted once in a sort operation at ordinary temperature and once in a sort operation at high temperature.

A test technique for nonvolatile memories, such as flash memory cards, is detailed in the specification filed for Japanese Patent Application No. 2002-141267 and the drawings appended thereto.

Figure 22:
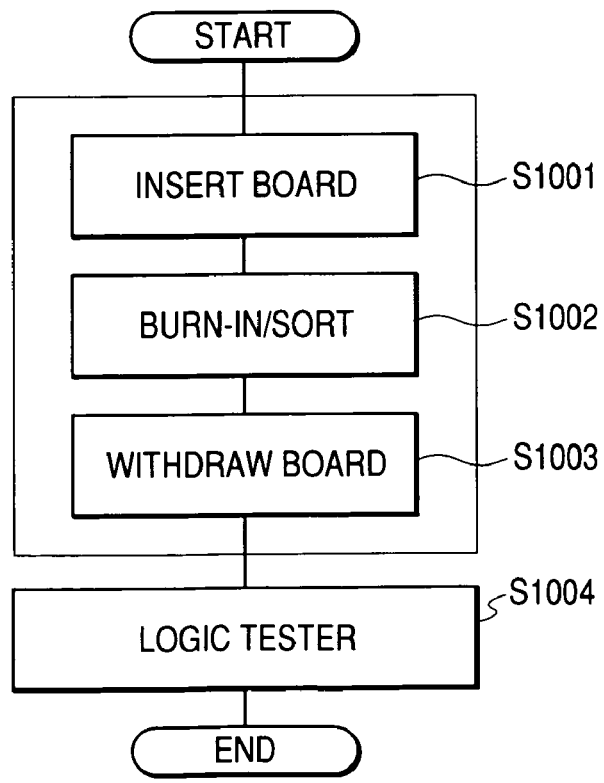
FIG. 22 is a flowchart of the memory test process based on batch processing considered previously by the present inventors.

FIG. 22 is a flowchart of the memory test process based on batch processing considered previously by the present inventors.

In batch processing, a large number (e.g. 72 pieces or so) of test boards are prepared, and a large number (e.g. 1000 pieces or so) of semiconductor integrated circuit devices are simultaneously subjected to a memory test.

In this case, the memory test is conducted as follows: semiconductor integrated circuit devices to be tested are mounted in all the test boards (Step 1001), and they are subjected to burn-in and memory test as a group (Step 1002). After the completion of the memory test, all the semiconductor integrated circuit devices mounted in the test boards are dislodged (Step 1003). Then, testing is carried out using a logic tester (Step 1004).

Figure 23:
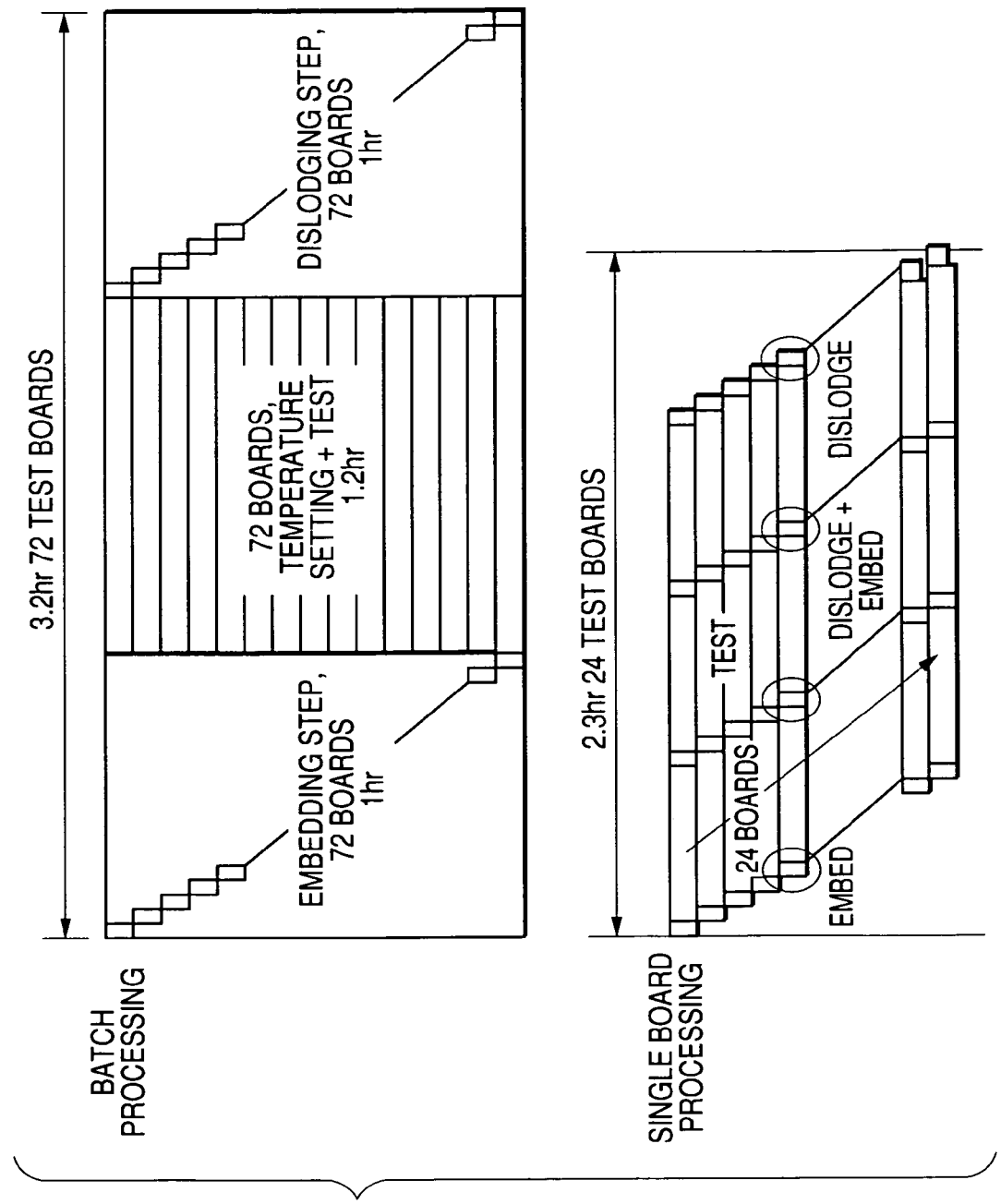
FIG. 23 is a diagram in which the memory test with the test burn-in system in FIG. 1 is compared with the memory test based on batch processing illustrated in FIG. 22.

FIG. 23 is a diagram in which the memory test with the test is compared burn-in system 1, with the memory test being based on batch processing considered previously by the present inventors.

The upper part of FIG. 23 illustrates the relation between the processing time and the number of boards in the memory test based on batch processing. The lower part illustrates the relation between the processing time and the number of boards in the memory test based on single board processing with the test burn-in system 1. The test conditions are as follows: the test time is 30 minutes, and, for example, about 1000 semiconductor integrated circuit devices are tested by a sort operation at high temperature.

The figure indicates the following: when, for example, 72 test boards are subjected to batch processing, the time required for the embedding step in which semiconductor integrated circuit devices are mounted in all the test boards is about 1 hour. About 1.2 hours is required for the subsequent steps: the 72 test boards being taken into the thermostatic bath, temperature setting, memory test, and the test boards being cooled.

After the completion of the memory test, about 1 hour is required again for dislodging the semiconductor integrated circuit devices from each test board. Thus, the total processing time for the memory test is as long as about 3.2 hours.

In batch processing, as described above, test boards are mounted with semiconductor integrated circuit devices one by one in the embedding step. Therefore, the remaining 71 test boards are kept in a wait state. With respect to temperature setting for the thermostatic bath, another problem arises.

After the test boards are all taken in, the thermostatic bath is wholly heated; therefore, it takes a long time to raise or lower the temperature.

In single board processing with the test burn-in system 1, the memory test is conducted using the sequence described in connection with FIG. 21, using about 24 test boards. As a result, the memory test on all of the semiconductor integrated circuit devices is completed in 2.3 hours or so.

As mentioned above, single board processing makes it possible to reduce the number of test boards 4 used and to shorten the test time.

Figure 24:
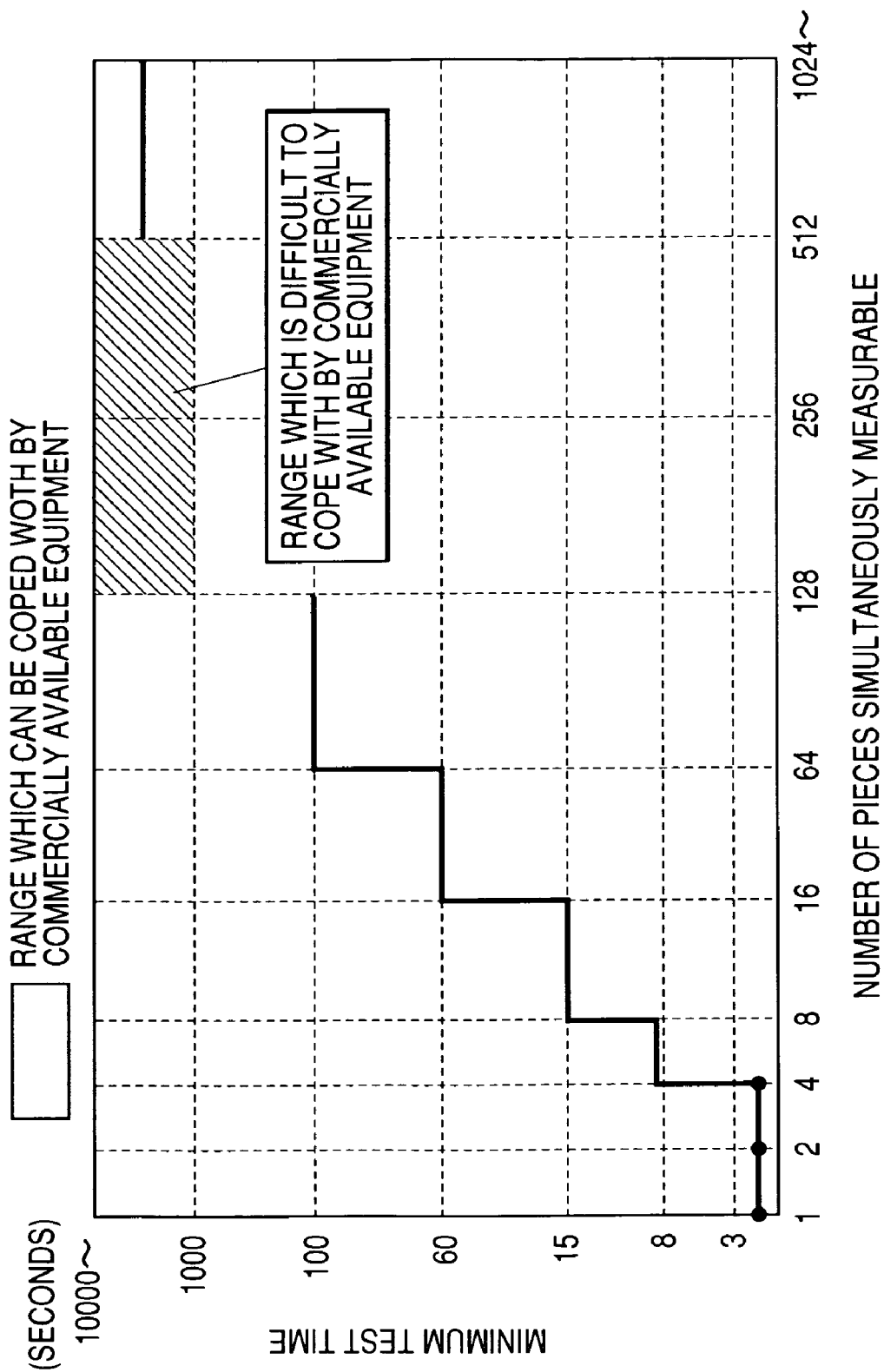
FIG. 24 is a graph illustrating the relation between test time and number of pieces measured in various test systems.

FIG. 24 is a graph illustrating the relation between the test time and the number of pieces measured in common test systems.

With respect to a logic tester, for example, the number of pieces measured is one piece to four pieces or so, and the test time is several seconds or so. With respect to a memory tester without a burn-in function, the number of pieces measured is several pieces to 128 pieces or so, and the test time is ten seconds to ten minutes or so. With respect to a test burn-in system based on batch processing, the number of pieces measured is about 500 pieces or more to 10000 pieces or so, and the test time is about 8 hours to about 100 hours.

As mentioned above, there are no test systems that are capable of efficiently testing 128 to about 512 semiconductor integrated circuit devices in a test time of about ten minutes to several tens of minutes (the hatched area in the figure). The test burn-in system 1 (or test burn-in systems) is a test system that is suitable for accomplishing the following: reasonably adapting to such test time and attaining throughputs equal to or higher than those achieved with test burn-in systems based on batch processing, using a smaller number of test boards.

Figure 25:
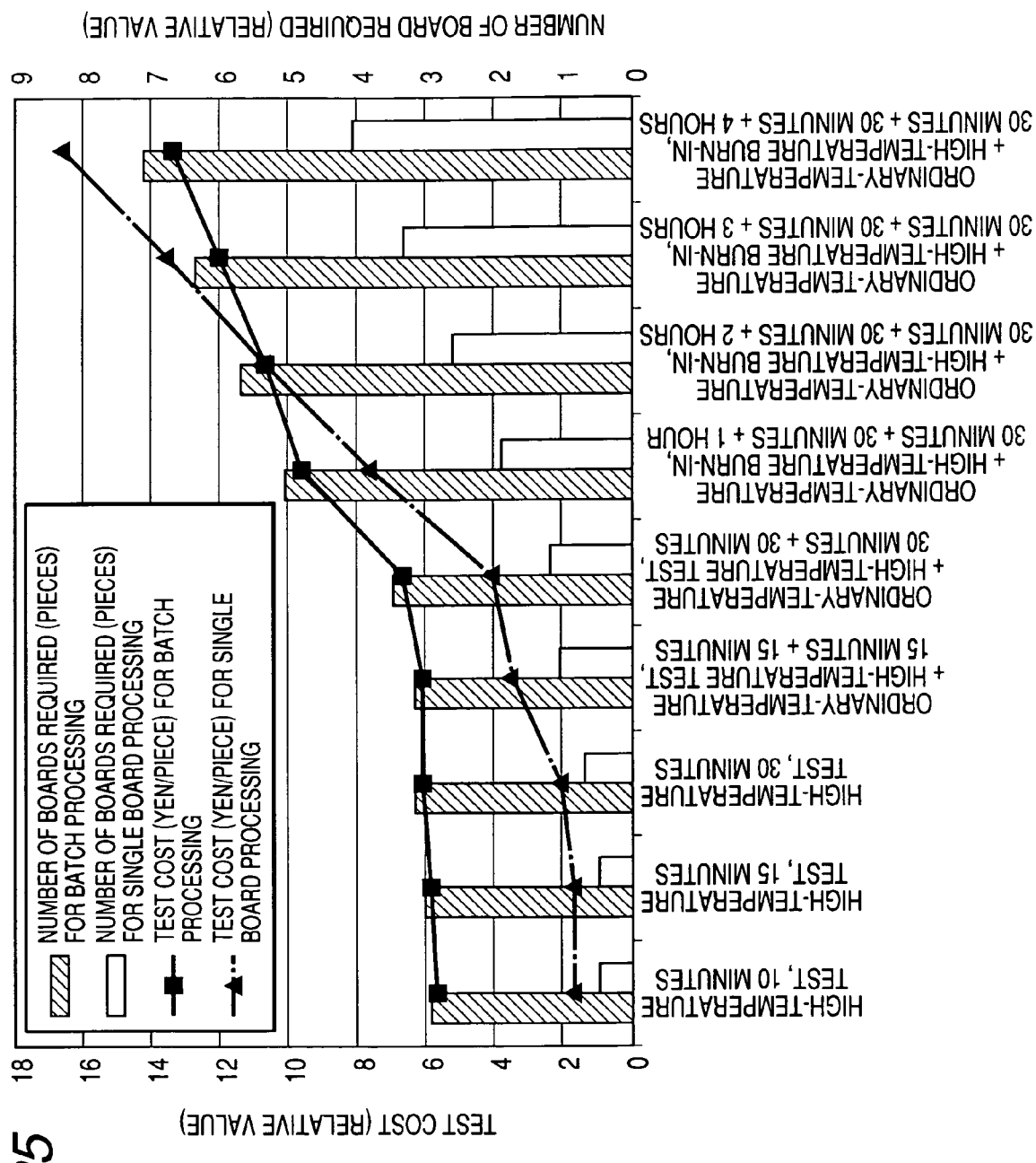
FIG. 25 is a graph in which the test burn-in system in FIG. 1 is compared with the test burn-in system based on batch processing in FIG. 22, considered previously by the present inventors, with respect to the effects thereof.

FIG. 25 is a graph in which the test burn-in system 1 based on single board processing is compared with the previously considered test burn-in system based on batch processing, with respect to the effects thereof.

FIG. 25 compares the number of test boards required and the cost of a memory test in cases where a predetermined quantity of semiconductor integrated circuit devices are subjected to a memory test every month. This is a relative comparison where the cost of the memory test is computed based on a presumptive cost model. (The cost model includes the cost of test boards required, the investment and amortization costs of equipment, personnel cost, the cost of utilities, including electricity, and the yield of the memory test.)

In the figure, the hatched bar graphs indicate the number of test boards required (relative value) under various test conditions in batch processing. The hollow bar graphs indicate the number of test boards required (relative value) under various test conditions in single board processing.

The solid line graph indicates the test cost (relative value) under various test conditions in batch processing. The dashed line graph indicates the test cost (relative value) under various test conditions in single board processing.

In this case, as illustrated in FIG. 25, the test cost can be significantly reduced under the condition that the test time (including burn-in) is short, especially, under the condition that burn-in is not carried out and the test is conducted at either a high temperature or an ordinary temperature.

Under the test condition that burn-in is carried out and both a sort at ordinary temperature and a sort at high temperature are carried out, the result is different. That is, the cost of the memory test is lower in batch processing than in single board processing despite an increase in the number of test boards.

As seen from these results, the test efficiency can be more significantly enhanced by using different memory tests on a case-by-case basis: when it takes a short time to conduct a memory test on semiconductor integrated circuit devices, the test is carried out by single board processing; when it takes the memory test a long time (especially, when burn-in is carried out), the test is carried out by batch processing.

Thus, according to this embodiment, the number of test boards 4 used can be reduced, and, further, the time required for the memory test can be significantly shortened. As a result, the manufacturing cost of the semiconductor integrated circuit devices 20 can be reduced.

Up to this point, the invention made by the present inventors has been specifically described based on an embodiment. However, the present invention is not limited to this embodiment, and various modifications may be made without departing from its subject matter.

The above description of the embodiment relates to a memory test on semiconductor integrated circuit devices in the form of a SiP product. This memory test is also applicable to other semiconductor integrated circuit devices than SiPs, as long as they can be subjected to a memory test using test boards.

Such semiconductor integrated circuit devices include, for example, products, such as MCPs (Multi Chip Packages), which do not contain a microcomputer (CPU) and are constituted of a plurality of semiconductor memories, such as a flash memory, a SRAM, and a DRAM; SoC (System on Chip) products wherein the major functions of a microprocessor, chip set, video chip, and the like are integrated into one semiconductor chip; semiconductor integrated circuit devices, such as a memory products including large-capacity flash memories, which are equipped with BIST, can be simultaneously subjected to memory test in large quantities, and take too much time to test with a memory tester or a handler; and the like.

The present invention is effective not only for the above-mentioned semiconductor integrated circuit devices. It is effective also for memory card products, such as multimedia cards, which take too much time to test with a memory tester/handler, memory module products, and the like.

The test method for semiconductor integrated circuit devices according to the present invention is suitable as a technique for efficiently conducting a memory test on semiconductor integrated circuit devices, including a semiconductor memory at low cost.

What is claimed is:

1. A fabrication method of semiconductor integrated circuit devices, comprising the steps of:
    (a) taking one test board whose testing has been completed out of a thermostatic bath while testing is underway on a plurality of semiconductor integrated circuit devices mounted in a plurality of test boards, placed therein;
    (b) dislodging the semiconductor integrated circuit devices from the test board taken out;
    (c) mounting a plurality of semiconductor integrated circuit devices to be tested in the test board with the semiconductor integrated circuit devices dislodged therefrom; and
    (d) taking the test board mounted with the semiconductor integrated circuit devices into the thermostatic bath and putting the test board taken in to the test.

2. The fabrication method of semiconductor integrated circuit devices according to claim 1, comprising the steps of:
    mounting a plurality of semiconductor integrated circuit devices to be newly tested in the test board while testing is underway on the semiconductor integrated circuit devices mounted in the test boards placed in the thermostatic bath; and
    taking the test board mounted with the semiconductor integrated circuit devices to be newly tested into the thermostatic bath when the test board whose testing has been completed is taken out of the thermostatic bath, and putting the test board to the test.

3. The fabrication method of semiconductor integrated circuit devices according to claim 2,
    wherein in the thermostatic bath, first slots and second slots are different from each other in temperature.

4. The fabrication method of semiconductor integrated circuit devices according to claim 1, comprising the steps of:
    testing the semiconductor integrated circuit devices mounted in the test board in the thermostatic bath set to a first temperature; and
    testing the semiconductor integrated circuit devices mounted in the test board in the thermostatic bath set to a second temperature after the completion of testing at the first temperature.

5. The fabrication method of semiconductor integrated circuit devices according to claim 4, comprising the steps of:
    setting the thermostatic bath to the first temperature and testing the semiconductor integrated circuit devices; and
    setting the thermostatic bath to the second temperature after the completion of testing at the first temperature and testing the semiconductor integrated circuit devices.

6. The fabrication method of semiconductor integrated circuit devices according to claim 5,
    wherein testing on the semiconductor integrated circuit devices at the first temperature and testing on the semiconductor integrated circuit devices at the second temperature are carried out in different thermostatic baths.

7. The fabrication method of semiconductor integrated circuit devices according to claim 1, comprising the steps of:
    mounting semiconductor integrated circuit devices in the test board by a handler; and
    supplying test boards mounted with the semiconductor integrated circuit devices to the thermostatic bath of the inspection machine one by one by the handler; and
    sorting out and putting in the cooled semiconductor integrated circuit devices based on the test result by the handler after the completion of test.

8. The fabrication method of semiconductor integrated circuit devices according to claim 7,
    wherein semiconductor integrated circuit devices mounted in a first test board by the handler and semiconductor integrated circuit devices mounted in a second test board by the handler are different from each other in type.

9. The fabrication method of semiconductor integrated circuit devices according to claim 1,
    wherein the semiconductor integrated circuit devices comprises SiP products wherein a plurality of semiconductor chips, such as logic and semiconductor memory, are encapsulated in one package.

* * * * *